United States Patent [19]
Iida et al.

[11] Patent Number: 5,527,417
[45] Date of Patent: Jun. 18, 1996

[54] PHOTO-ASSISTED CVD APPARATUS

[75] Inventors: Yoshinori Iida; Akihiko Furukawa, both of Tokyo; Tetsuya Yamaguchi, Yokohama; Michio Sasaki, Yokohama; Hisanori Ihara, Yokohama; Hidetoshi Nozaki, Yokohama; Takaaki Kamimura, Kawasaki, all of Japan

[73] Assignee: Kabushiki Kaisha Toshiba, Kawasaki, Japan

[21] Appl. No.: 446,290

[22] Filed: May 22, 1995

Related U.S. Application Data

[63] Continuation of Ser. No. 85,930, Jul. 6, 1993, abandoned.

[30] Foreign Application Priority Data

Jul. 6, 1992 [JP] Japan .................. 4-178685

[51] Int. Cl.$^6$ .................. C23F 1/02
[52] U.S. Cl. .......... 156/345; 118/723 R; 118/723 MP; 118/723 E
[58] Field of Search .......... 118/723 R, 723 MP, 118/723 E, 724, 725; 156/345, 643.1; 427/54.1, 53.1; 313/607

[56] References Cited

U.S. PATENT DOCUMENTS

| | | | |
|---|---|---|---|
| 4,811,684 | 3/1989 | Tashiro | 118/50.1 |
| 4,816,294 | 3/1989 | Tsuo | 427/531 |
| 4,918,028 | 4/1990 | Shirai | 437/81 |
| 4,974,542 | 12/1990 | Hayashi | 118/722 |
| 5,074,456 | 12/1991 | Degner | 228/121 |
| 5,183,511 | 2/1993 | Yamazaki | 118/723 |
| 5,215,588 | 6/1993 | Rhieu | 118/715 |
| 5,223,039 | 6/1993 | Suzuki | 118/723 |

FOREIGN PATENT DOCUMENTS

| | | |
|---|---|---|
| 61-183923 | 8/1986 | Japan . |
| 02213130 | 8/1990 | Japan . |
| 02213130 | 8/1990 | Japan . |
| 02220436 | 9/1990 | Japan . |
| 03110844 | 5/1991 | Japan . |

*Primary Examiner*—R. Bruce Breneman
*Assistant Examiner*—Joni Y. Chang
*Attorney, Agent, or Firm*—Oblon, Spivak, McClelland, Maier & Neustadt

[57] ABSTRACT

A photo-assisted CVD apparatus including a reaction chamber for storing a substrate, an inlet port for feeding a source gas into the reaction chamber, a light source for radiating light on the source gas fed into the reaction chamber to decompose the source gas upon radiating the light, thereby depositing a film on the substrate, an inlet port for supplying an etching gas into the reaction chamber, and a discharge electrode, arranged above the substrate and having a configuration, surrounding a space above the substrate, for exciting the etching gas.

12 Claims, 29 Drawing Sheets

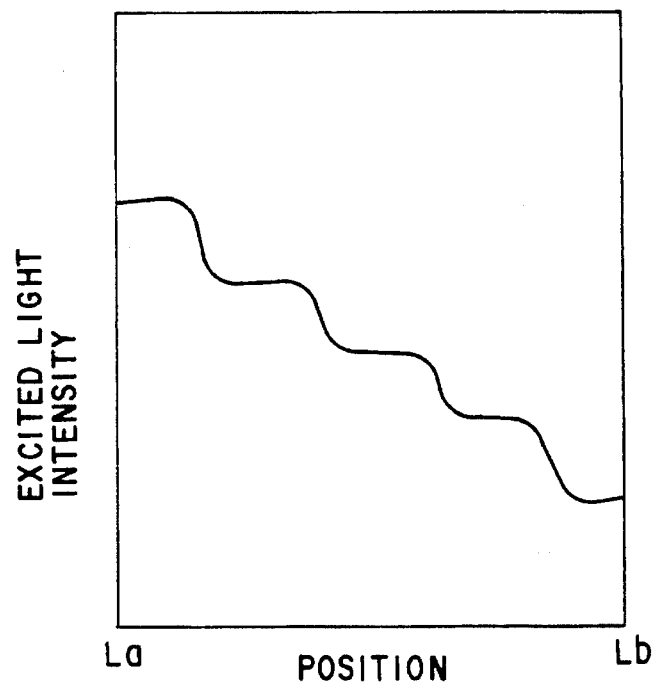
F I G. 4
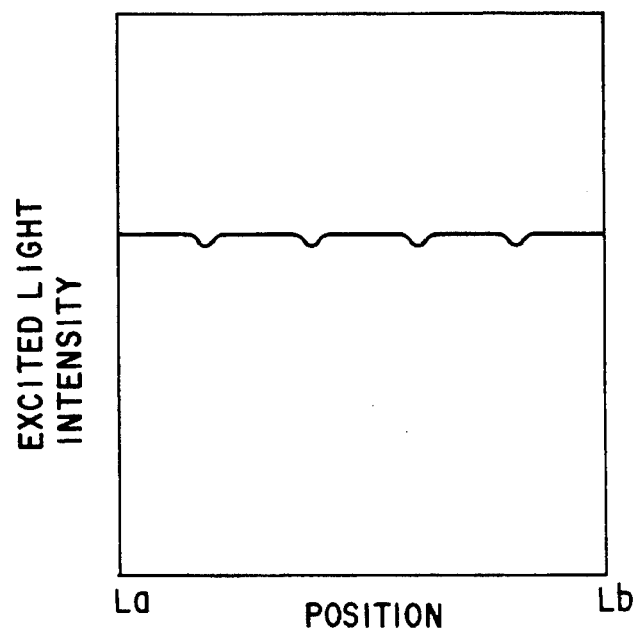
F I G. 5

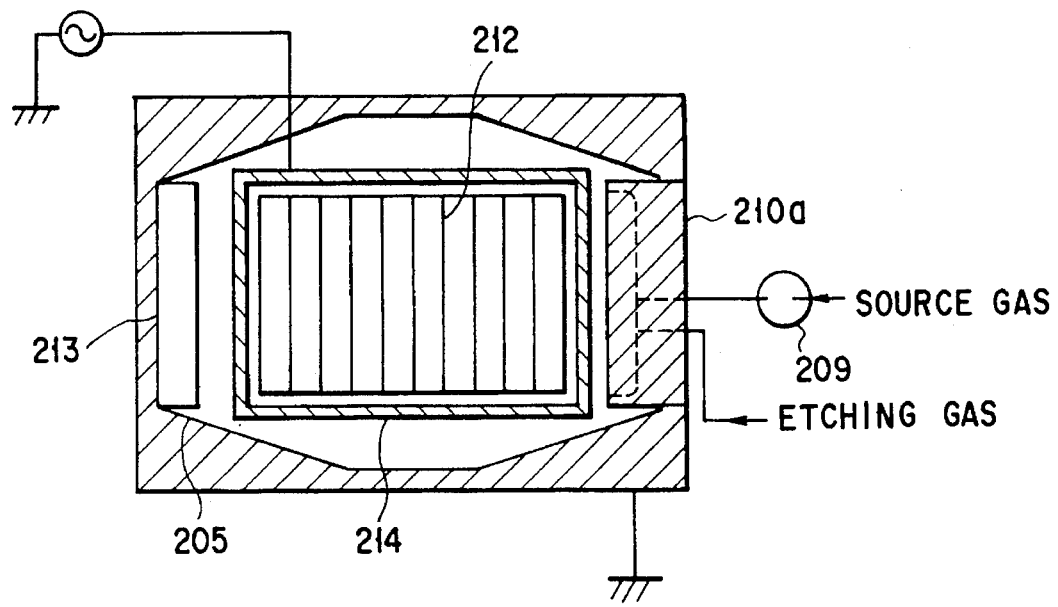
F I G. 15A
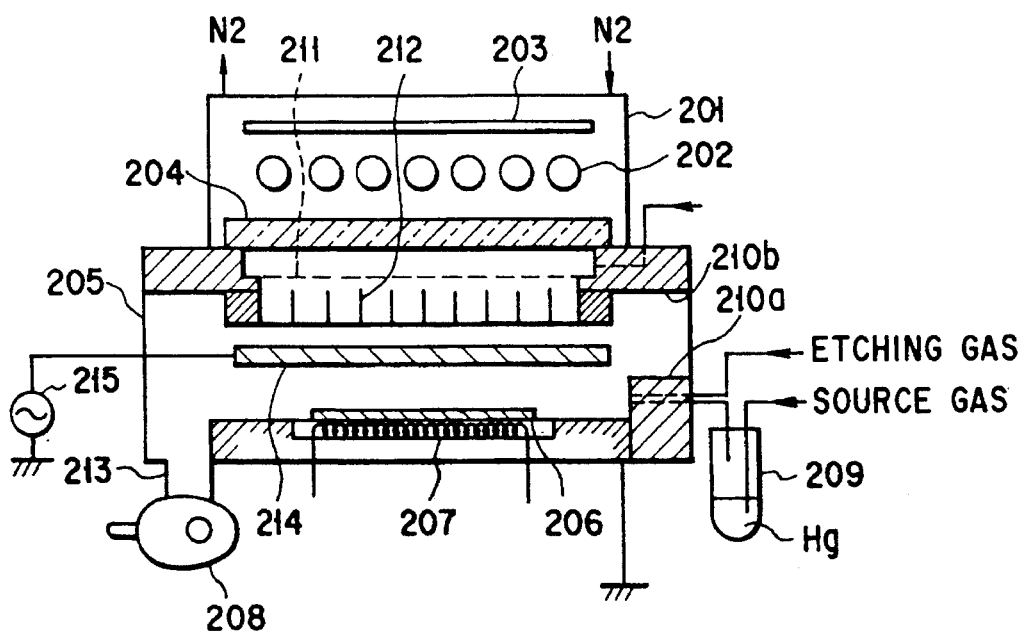
F I G. 15B

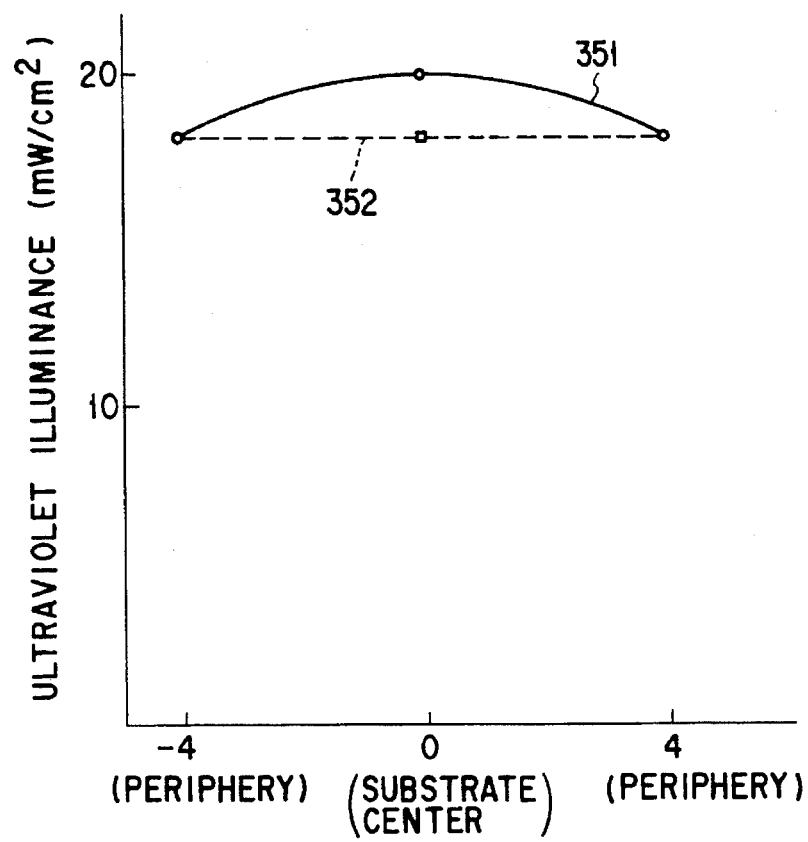
F I G 19
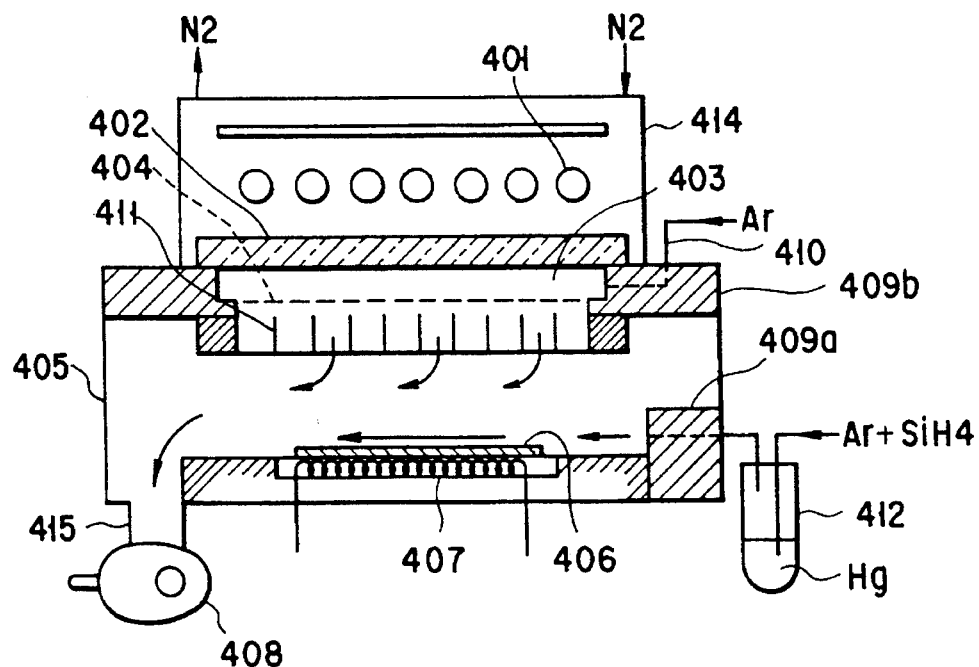
F I G. 20

FLOW DIRECTION OF SOURCE GAS ←

FLOW DIRECTION OF SOURCE GAS ←

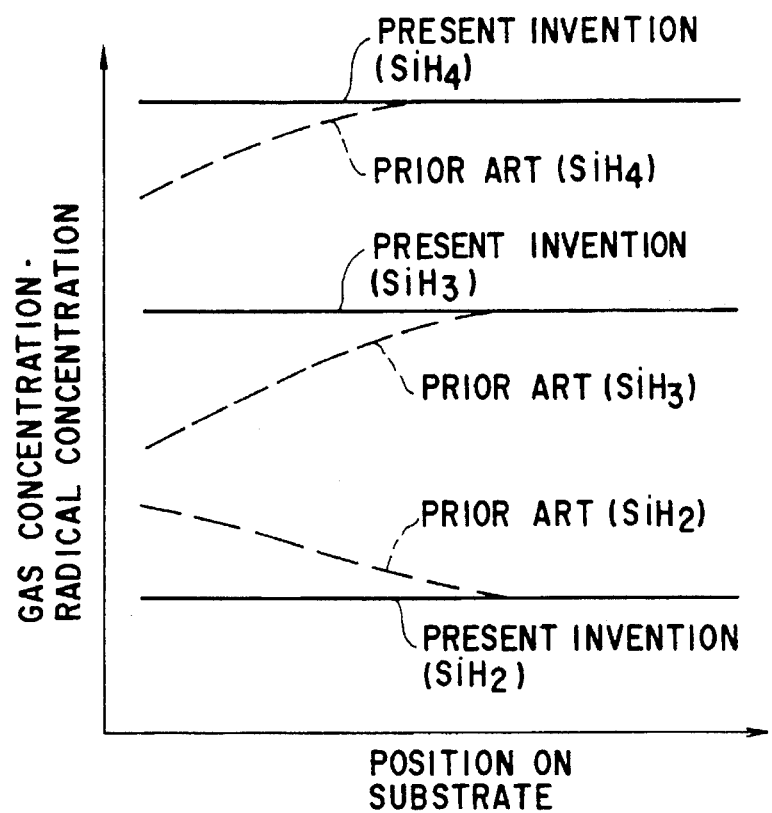
F I G. 26A
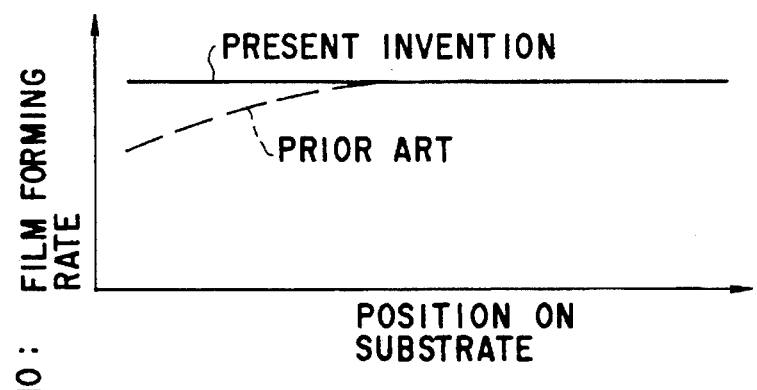
F I G. 26B
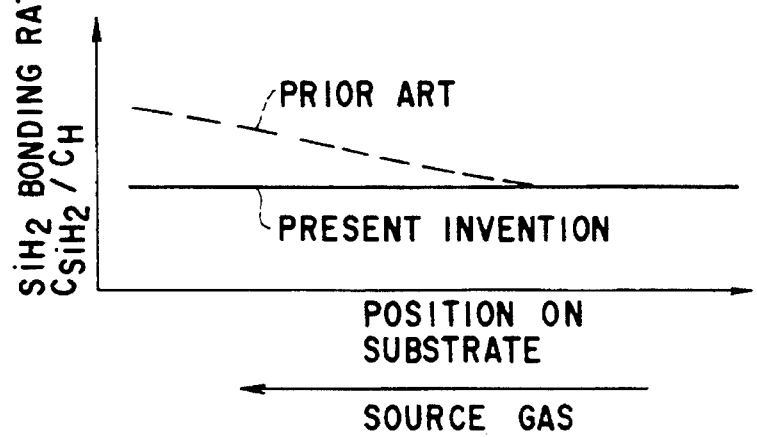
F I G. 26C

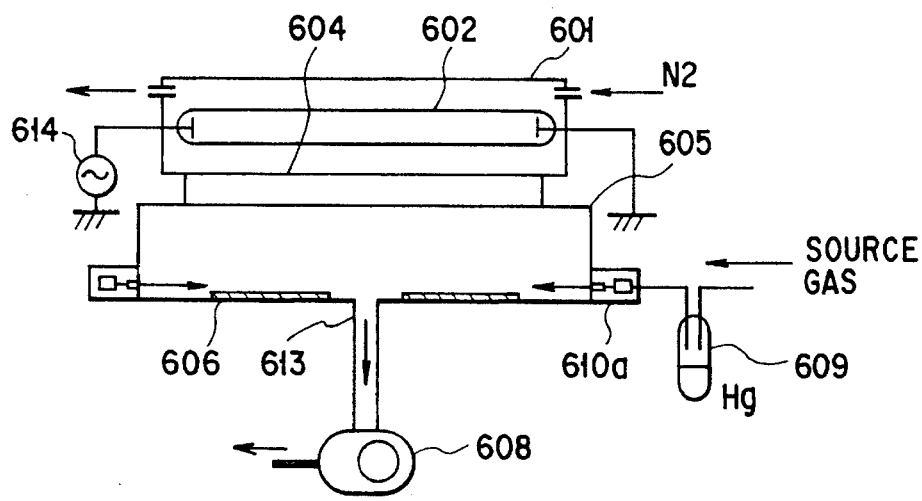
F I G. 34
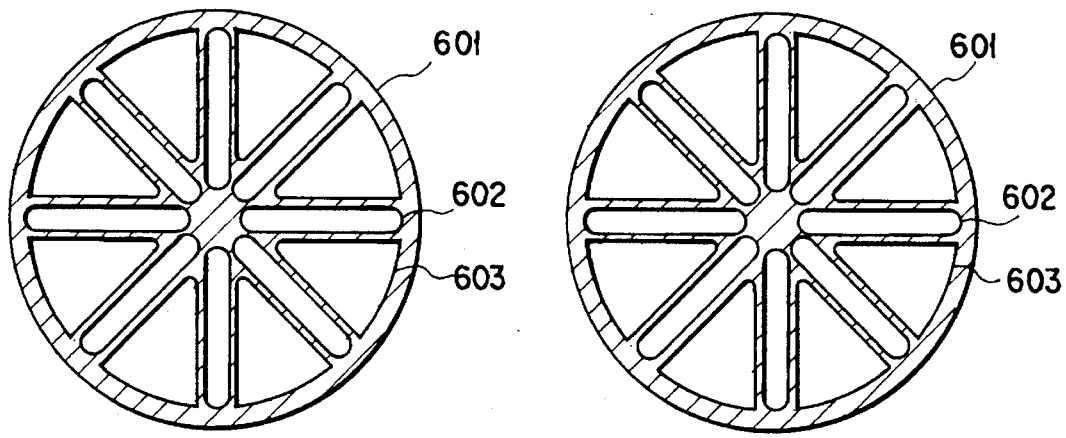
F I G. 35
F I G. 37
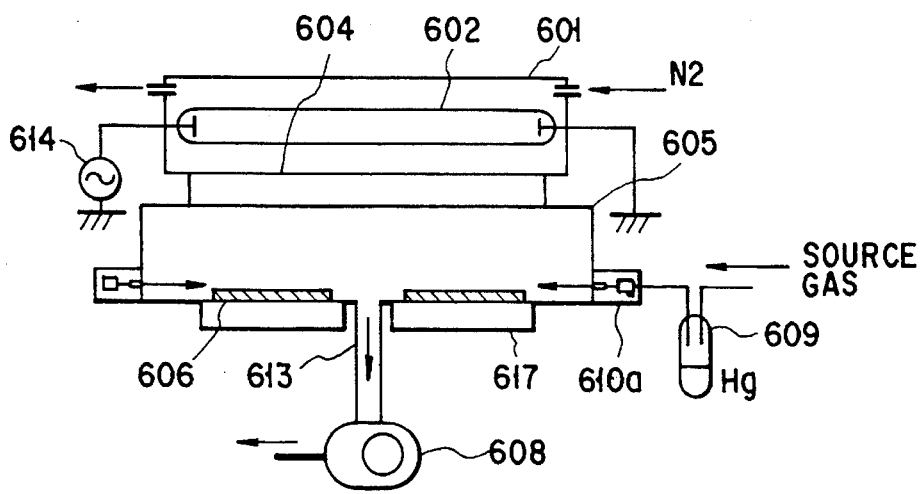
F I G. 36

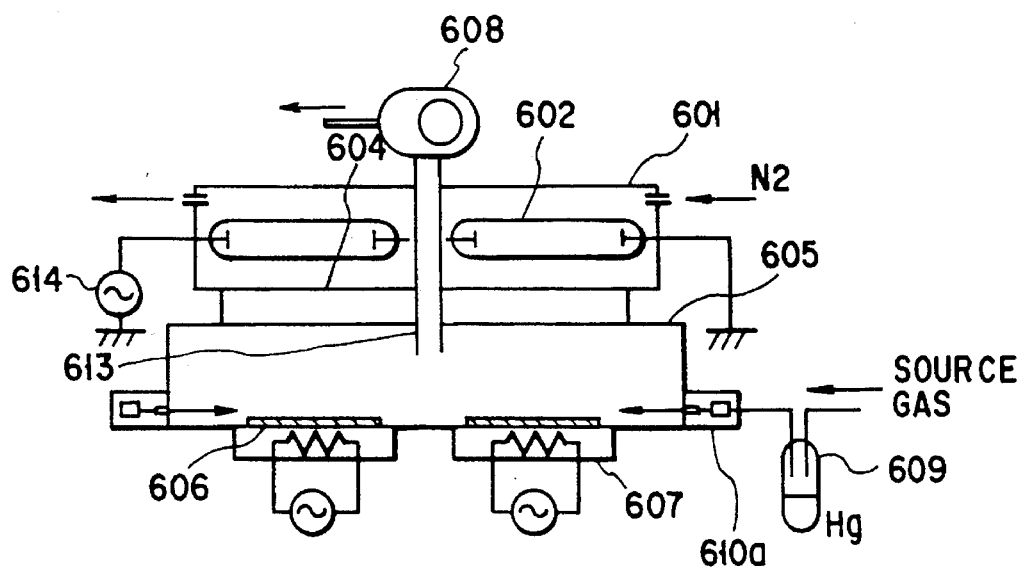
F I G. 38
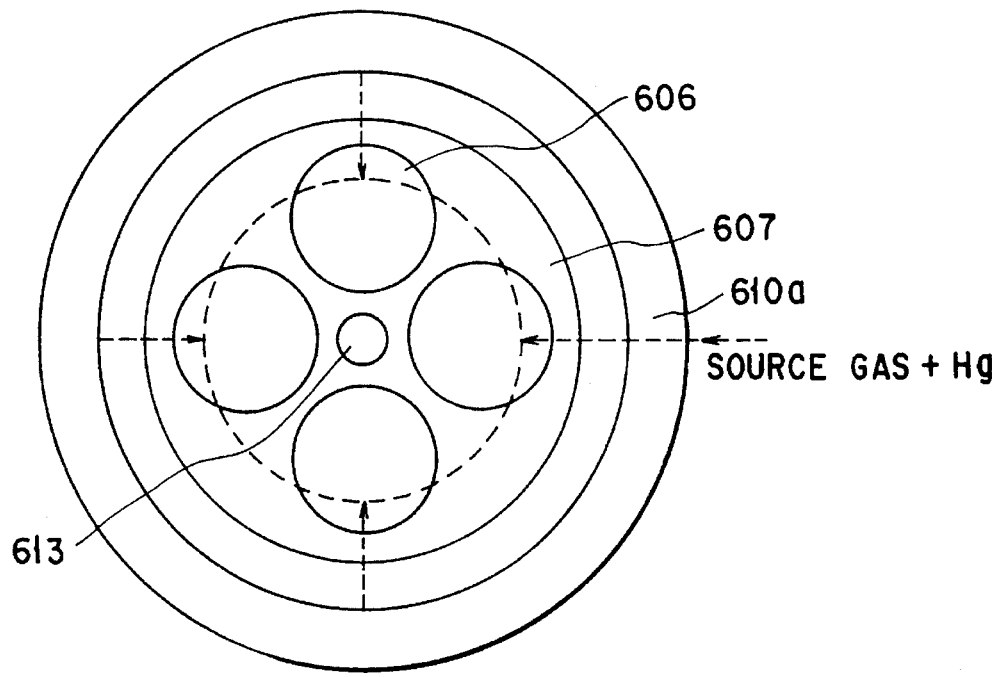
F I G. 39

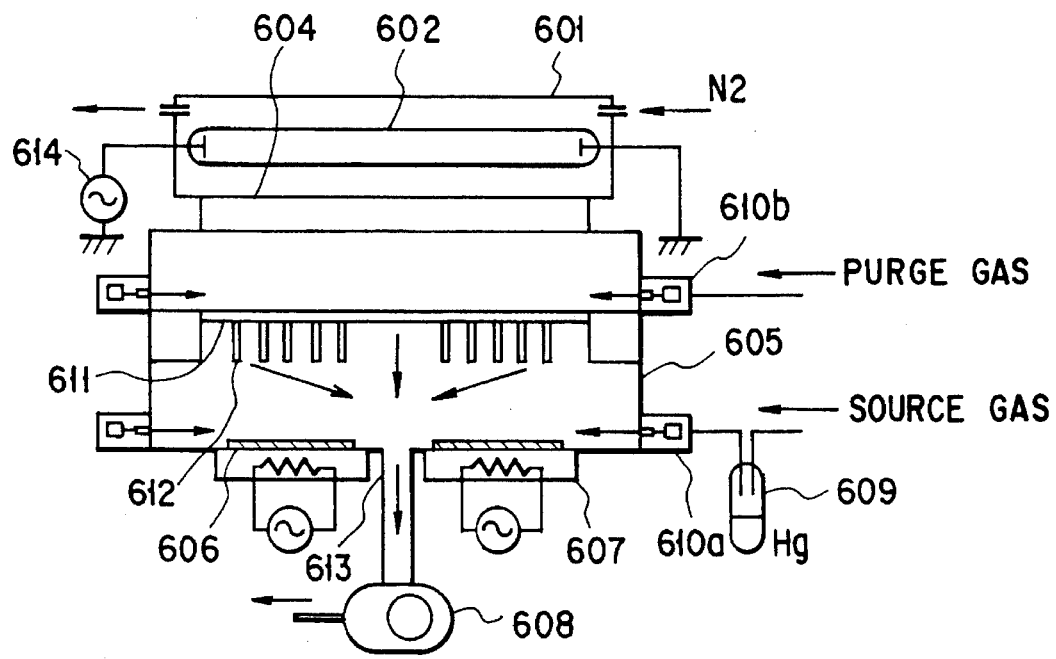
F I G. 42
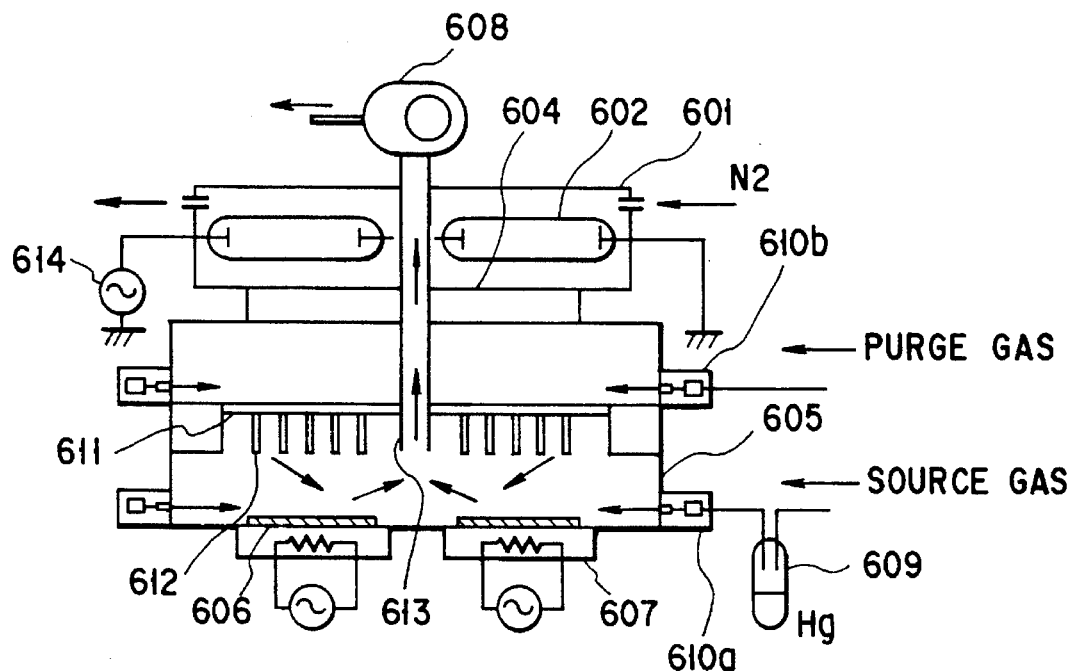
F I G. 43

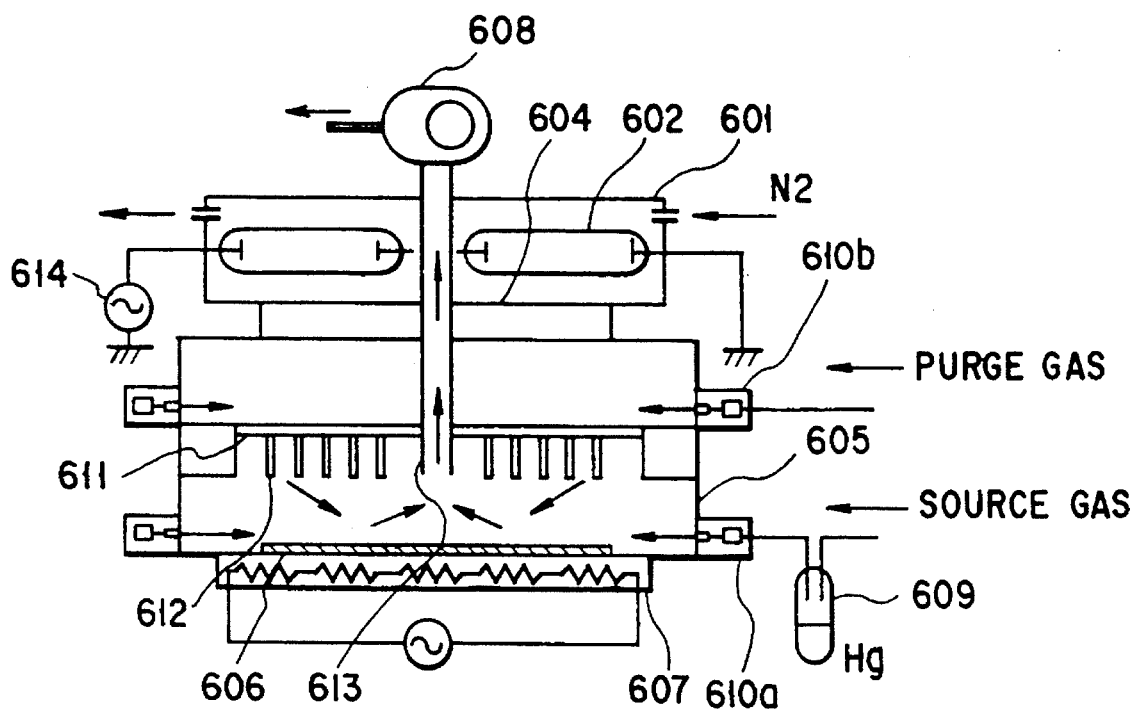
F I G. 44

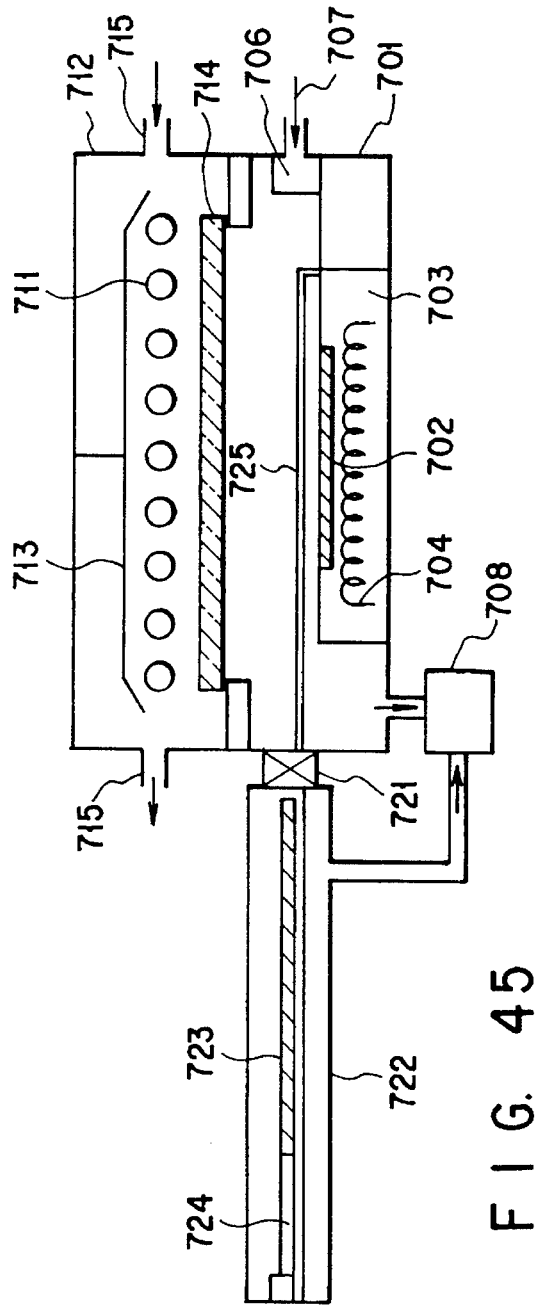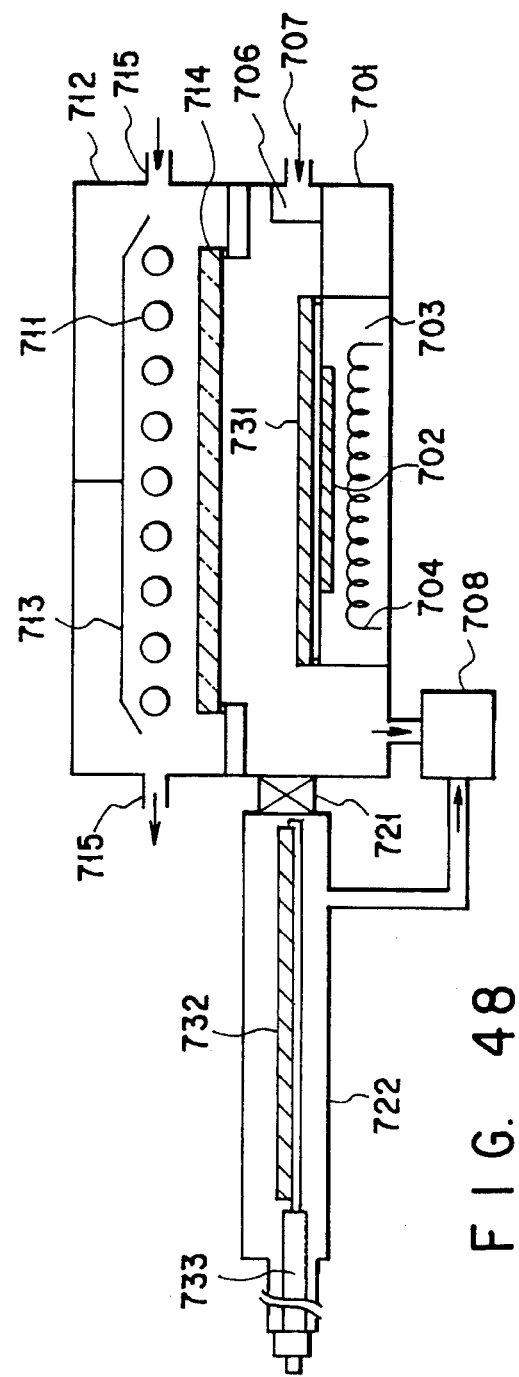

5,527,417

PHOTO-ASSISTED CVD APPARATUS

This application is a continuation of application Ser. No. 08/085,930, filed Jul. 6, 1993, now abandoned.

BACKGROUND OF THE INVENTION

1. Field of the Invention

The present invention relates to photo-assisted CVD (photo-assisted chemical vapor deposition) and, more particularly, to a photo-assisted CVD apparatus for forming semiconductor thin films having uniform quality at a high throughput and a photo-assisted CVD method.

2. Description of the Related Art

In recent years, a photo-assisted CVD method in which source gases such as silane and disilane are decomposed by using optical energy and chemically reacted to form a semiconductor thin film or the like has received a great deal of attention.

According to the photo-assisted CVD method, a film can be advantageously formed at a temperature lower than that of a conventional thermal CVD method in which a source gas is decomposed by using a thermal energy. In the photo-assisted CVD method, unlike a plasma CVD method, damage to a substrate, caused by charged particles, can be considerably suppressed because radicals are used as a species contributing to the formation of a film. The photo-assisted CVD method has high controllability, and a high-quality thin film can be formed.

FIG. 1 is a schematic view showing the arrangement of a conventional laminar flow type photo-assisted CVD apparatus using a mercury sensitization method.

In FIG. 1, a target substrate 106 is placed inside a reaction chamber 105. The target substrate 106 is heated by a heater 107. A lamp house 101 is arranged above the reaction chamber 105. A low-pressure mercury lamp 102 is meanderingly arranged in the lamp house 101 as shown in the plan view of the upper portion of FIG. 1, and the low-pressure mercury lamp 102 is connected to a power supply 113. An $N_2$ gas is fed to the lamp house 101 as a purge gas to prevent ultraviolet attenuation caused by light absorption of atmospheric components (oxygen gas, water vapor, and the like).

A reflection plate 103 is arranged above the low-pressure mercury lamp 102. Light rays emitted from the low-pressure mercury lamp 102 are directly radiated on the target substrate 106 through a light-receiving window 104 or reflected from the reflection plate 103 to be radiated on the target substrate 106 through the light-receiving window 104.

A gas flow control plate 112 consisting of a material transparent to ultraviolet rays, e.g., quartz, is arranged below the low-pressure mercury lamp 102. A purge gas feed nozzle plate 111 transparent to ultraviolet rays and having a large number of through holes is arranged between the gas flow control plate 112 and the light-receiving window 104.

A mercury reservoir 109 for storing mercury whose temperature is kept constant, a source gas supply portion (not shown) for storing a source gas such as $SiH_4$, a purge gas supply portion (not shown) containing an inert gas such as Ar serving as a purge gas, and a gas exhaust portion 108 constituted by a vacuum exhaust pump are arranged outside the reaction chamber 105. A mechanism for mixing a material absorbing ultraviolet rays with the purge gas may also be arranged.

A source gas A supplied from the source gas supply portion is fed into the reaction chamber 105 through the mercury reservoir 109 and a source gas feed nozzle 110a. That is, the source gas A and a mercury vapor flow in the reaction chamber 105.

A purge gas B supplied from the purge gas supply portion is sprayed on the target substrate 106 through a purge gas feed nozzle 110b, the purge gas feed nozzle plate 111, and the gas flow control plate 112. As a result, a gas mixture C of the source gas A and the mercury vapor flows parallelly to the target substrate 106 to form a laminar flow of the gas mixture C near the surface of the target substrate 106 and to form a laminar flow of the purge gas B at portions except for the portion near the surface of the target substrate 106.

In the photo-assisted CVD apparatus described above, in general, the size of an ultraviolet source (the low-pressure mercury lamp 102) serving as an optical energy source cannot easily be considerably larger than that of the target substrate 106 because the cost is increased. The ultraviolet source is larger than the target substrate 106 by one size. For this reason, the illuminance of ultraviolet rays is high at the central portion of the target substrate 106, and the illuminance of ultraviolet rays is low at the peripheral portion of the substrate. Therefore, a film forming rate at the central portion of the substrate is higher than that at the peripheral portion of the substrate, and a semiconductor thin film having uniform film quality and a uniform thickness cannot easily be obtained.

In the photo-assisted CVD method, in general, all reaction products are not always deposited on the substrate, and some of the reaction products are deposited on the inner wall of the reaction chamber. In this manner, when the film deposited on the inner wall of the reaction chamber is peeled, dust is produced in the reaction chamber, and a production yield is decreased. For this reason, the film deposited on the inner wall of the reaction chamber must be removed.

As a method of removing the film deposited on the inner wall of the reaction chamber, an overhaul cleaning method, a plasma discharge cleaning method, or the like is proposed. However, these methods have the following problems.

In the overhaul cleaning method, a reaction chamber is open to the atmosphere to remove a film deposited on the inner wall of the reaction chamber by chemical and mechanical methods. According to the method, the inner wall of the reaction chamber absorbs contaminants in the atmosphere. For this reason, a process of removing the contaminants, i.e., a vacuum exhaust process, is newly required, thereby decreasing the throughput in film formation.

On the other hand, in the plasma discharge cleaning apparatus, a deposit can be removed from the inner wall of the reaction chamber without exposing the inner wall to the atmosphere because the deposit is removed by plasma etching. In order to remove a deposit by the plasma discharge cleaning method in a photo-assisted CVD apparatus, plasma discharge electrodes (discharge electrodes) must be arranged in the reaction chamber. As shown in FIGS. 2A and 2B, two discharge electrodes whose longitudinal direction is parallel to a source gas flow are arranged on both the sides of the substrate. The discharge electrodes are arranged not to interfere with the flow of the source gas and irradiation of light.

The etching rate of the film deposited between the discharge electrodes in the reaction chamber is highest at portions near the discharge electrodes, decreased at a position far from the discharge electrodes, and lowest at a portion near the central portion between the discharge electrodes. For this reason, the time required for cleaning the inside of the reaction chamber is considerably prolonged, and a throughput is decreased.

As described above, in the conventional photo-assisted CVD apparatus, since the illuminance distribution of ultraviolet rays on the substrate is not uniformed, a semiconductor thin film having a uniform film thickness and uniform film quality or the like cannot easily be formed.

A film deposited on the inner wall of the reaction chamber must be removed before the film formation to prevent a decrease in yield. Although the deposit can be removed by the plasma discharge cleaning method without exposing the inner wall to the atmosphere, the time required for cleaning the reaction chamber is prolonged because the arrangement of the discharge electrodes is restricted. For this reason, a throughput is disadvantageously decreased.

SUMMARY OF THE INVENTION

The present invention has been made in consideration of the above circumstances, and has as its object to provide a photo-assisted CVD apparatus capable of forming a semiconductor film having a uniform film thickness and uniform film quality at a high throughput.

It is another object of the present invention to provide a photo-assisted CVD method capable of forming a semiconductor film having a uniform film thickness and uniform film quality at a high throughput.

According to the present invention, there is provided a photo-assisted CVD apparatus comprising:

a reaction chamber for storing a substrate;

means for feeding a source gas into the reaction chamber;

means for radiating light on the source gas fed into the reaction chamber to decompose the source gas upon radiating the light, thereby depositing a film on the substrate;

means for supplying an etching gas into the reaction chamber; and discharge electrode means, arranged above the substrate and having a configuration to surround a space above the substrate, for exciting the etching gas.

According to the present invention, there is also provided a photo-assisted CVD apparatus comprising:

a reaction chamber for storing a substrate;

means for feeding a source gas into the reaction chamber;

means for radiating light on the source gas fed into the reaction chamber to decompose the source gas upon radiating the light, thereby depositing a film on the substrate;

means for supplying an etching gas into the reaction chamber;

first discharge electrode means, arranged above the substrate and having a configuration to surround a space above the substrate, for exciting the etching gas.

second discharge electrode means, movable between a first position above the substrate in the reaction chamber, for exciting the etching gas; and means for transporting the second discharge electrode means between the first position and the second position.

According to the present invention, there is further provided a photo-assisted CVD method comprising the steps of:

feeding a source gas into a reaction chamber in which a substrate is stored;

radiating light into the reaction chamber through a light-receiving window arranged above the substrate to decompose the source gas in the reaction chamber, thereby forming a thin film on the substrate by a chemical reaction;

feeding an etching gas into the reaction chamber and feeding a gas inert to the etching gas into the reaction chamber to cause the inert gas to flow in a direction from the light-receiving window to the substrate; and producing an etching species in the reaction chamber by a plasma discharge to etch a deposit in the reaction chamber.

According to the present invention, there is still further provided a photo-assisted CVD apparatus comprising:

a reaction chamber for storing a substrate;

means for feeding a source gas into the reaction chamber;

means for radiating light on the source gas fed into the reaction chamber to decompose the source gas upon radiating the light, thereby depositing a film on the substrate; and means for increasing an illuminance of the light on the substrate in a flow direction of the source gas in the reaction chamber.

According to the present invention, there is still further provided a photo-assisted CVD apparatus comprising:

a reaction chamber for storing a substrate;

means for feeding a source gas into the reaction chamber;

a light-receiving window arranged in the reaction chamber;

means for radiating light on the source gas fed into the reaction chamber through the light-receiving window to decompose the source gas upon radiating the light, thereby depositing a film on the substrate;

a transparent nozzle arranged between the substrate and the light-receiving window and having a predetermined transmittance distribution; and means for supplying a gas inert to the source gas into a space between the light-receiving window and the transparent nozzle to control flow of the source gas.

According to the present invention, there is still further provided a photo-assisted CVD apparatus comprising:

a reaction chamber for storing a substrate;

means for feeding a source gas into the reaction chamber;

a light-receiving window arranged in the reaction chamber;

means for radiating light on the source gas fed into the reaction chamber through the light-receiving window to decompose the source gas upon radiating the light, thereby depositing a film on the substrate;

a transparent nozzle, which is arranged between the substrate and the light-receiving window and through which the source gas is sprayed, such that a gas spray amount on a downstream side of the source gas is larger than a gas spray amount on an upstream side of the source gas; and means for supplying a gas inert to the source gas into a space between the light-receiving window and the transparent nozzle to control flow of the source gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a graph showing a relationship between a substrate position and an excited light intensity in the photo-assisted CVD apparatus in FIG. 3;

FIG. 5 is a graph showing a relationship between a substrate position and an excited light intensity in the photo-assisted CVD apparatus in FIG. 1;

FIGS. 15A and 15B are schematic views showing the arrangement of a photo-assisted CVD apparatus according to the sixth embodiment of the present invention;

FIG. 19 is a graph showing a relationship between a position on a substrate and the illuminance of ultraviolet rays;

FIG. 20 is a schematic view showing the arrangement of a laminar flow type photo-assisted CVD apparatus according to the ninth embodiment of the present invention;

FIGS. 26A to 26C are graphs showing comparison between the effect of the CVD apparatus shown in FIG. 24 and the effect of the conventional CVD apparatus;

FIG. 34 is a schematic view showing the arrangement of a mercury-sensitized photo-assisted CVD apparatus according to the fifteenth embodiment of the present invention;

FIG. 35 is a view showing the shape of the ultraviolet source of the CVD apparatus shown in FIG. 34;

FIG. 36 is a schematic view showing the arrangement of a mercury-sensitized photo-assisted CVD apparatus according to the sixteenth embodiment of the present invention;

FIG. 37 is a view showing the shape of the ultraviolet source of the CVD apparatus shown in FIG. 36;

FIG. 38 is a schematic view showing the arrangement of a mercury-sensitized photo-assisted CVD apparatus according to the seventeenth embodiment of the present invention;

FIG. 39 is a view showing an arrangement of target substrates;

FIG. 42 is a schematic view showing the arrangement of a mercury-sensitized photo-assisted CVD apparatus according to the eighteenth embodiment of the present invention;

FIG. 43 is a schematic view showing the arrangement of a mercury-sensitized photo-assisted CVD apparatus according to the nineteenth embodiment of the present invention;

FIG. 44 is a schematic view showing the arrangement of a photo-assisted CVD apparatus in which a rectangular target substrate having a large area is stored;

FIG. 45 is a schematic view showing the arrangement of a photo-assisted CVD apparatus according to the twentieth embodiment of the present invention;

FIG. 48 is a schematic view showing the arrangement of a photo-assisted CVD apparatus according to the twenty-first embodiment of the present invention;

DETAILED DESCRIPTION OF THE PREFERRED EMBODIMENTS

Figure 1:
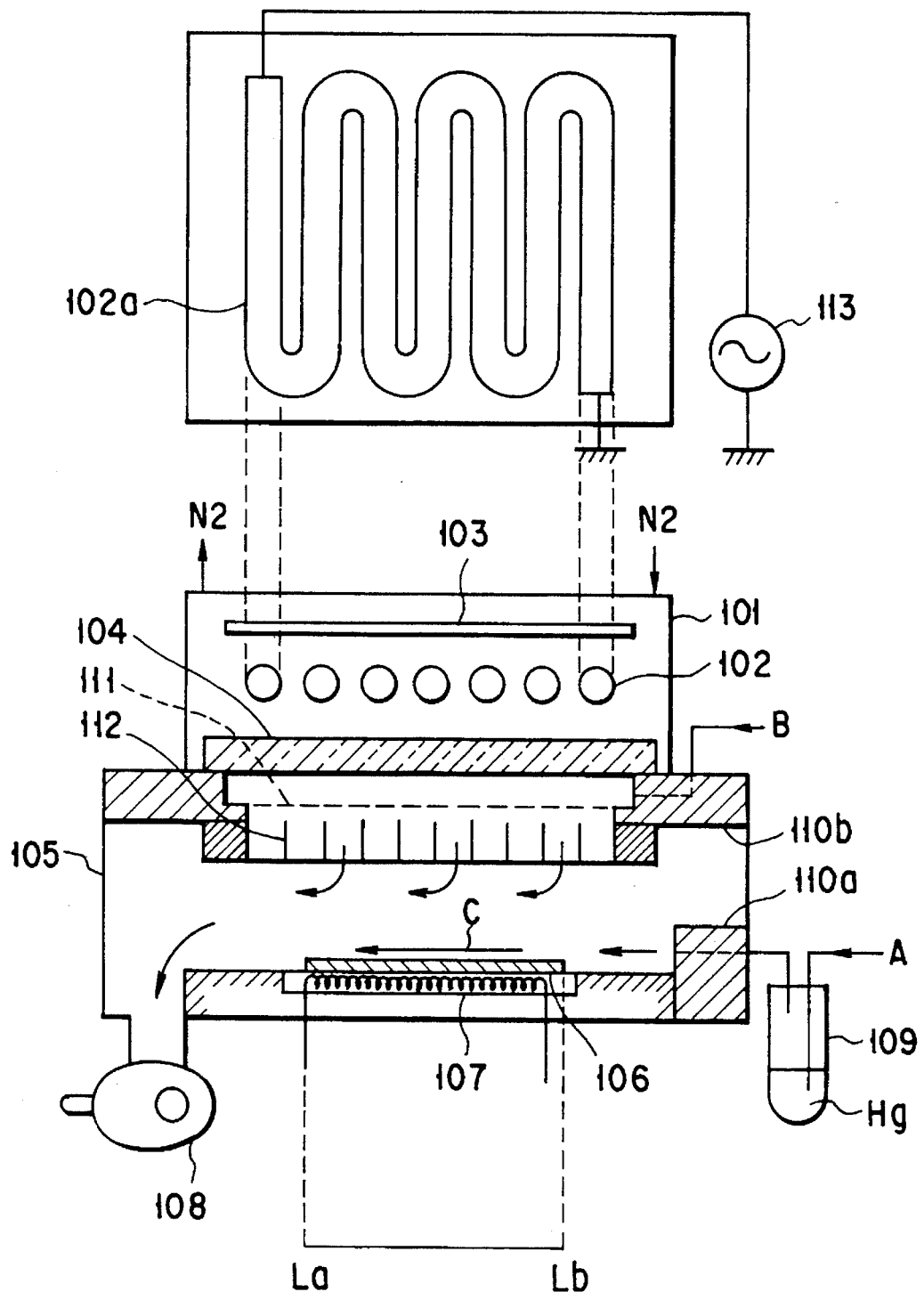
FIG. 1 is a schematic view showing the arrangement of a conventional photo-assisted CVD apparatus.

In a photo-assisted CVD apparatus according to the first aspect of the present invention, discharge electrodes having a configuration surrounding at least a space above a substrate are used as a discharge electrode for removing a deposit, so that a plasma discharge region is formed to surround a space above the substrate. For this reason, even when an etching gas flows into the space from any direction, a species produced in the plasma discharge region is transported by the flow of the etching gas.

That is, the transport of the etching species is performed by not only self-diffusion but also by the flow of the etching gas supplied into a reaction chamber. Therefore, the reaction chamber can be efficiently filled with the etching species, efficiency of removing a deposit can be improved, and a throughput can be increased.

In a photo-assisted CVD apparatus according to the second aspect of the present invention, discharge electrodes for removing a deposit can be freely conveyed into a reaction chamber and out of the reaction chamber. For this reason, when the discharge electrodes are conveyed out of the reaction chamber during a film forming operation, trouble caused by the discharge electrodes can be prevented. In addition, since parallel plate electrodes are used as the discharge electrodes, a plasma discharge region larger than that of conventional rod-like discharge electrodes can be obtained. Therefore, the time required for removing a deposit adhered on the inner wall of the reaction chamber can be shortened, and a throughput can be increased.

In a photo-assisted CVD apparatus according to the third aspect of the present invention, an etching gas is pressed downward by a purge gas. For this reason, an light-receiving window is not etched during etching of a deposit. Therefore, a decrease in film forming rate caused by a decrease in transmittance of the light-receiving window can be prevented.

The present invention is not limited to the first to third aspects, and the following various embodiments can be effected.

In a photo-assisted CVD apparatus according to the present invention, the illuminance of light on a substrate can be increased in the flow direction of a source gas. In this case, the decomposition amount of the source gas is increased in the flow direction of the source gas. For example, when an $SiH_4$ gas is used as the source gas, an amount of $SiH_3$ radicals produced by photolysis of the $SiH_4$ gas is increased in the flow direction of the $SiH_4$ gas. When the $SiH_4$ gas is used, $SiH_2$ radicals are also produced by a radical reaction between the $SiH_3$ radicals. In this case, a ratio of the $SiH_2$ radicals to the $SiH_3$ radicals ($SiH_2$ radicals/ $SiH_3$ radicals) is constant on the substrate because of the following reason. That is, the number of $SiH_2$ radicals is increased because the number of $SiH_2$ radicals is in proportion to the number of $SiH_3$ radicals. Therefore, an amount of material for forming a film is uniformed on the substrate, thereby obtaining a film having uniform film quality.

In the photo-assisted CVD apparatus according to the present invention, when the transmittance distribution of a transparent nozzle is controlled, an illuminance on the substrate can be uniformed. For this reason, a film forming rate is constant independently of positions, and a thin film having a uniform film thickness can be obtained.

In the photo-assisted CVD apparatus according to the present invention, an amount of purge gas on a substrate on the downstream side of a source gas can be set to be larger than that of a purge gas on the substrate on the upstream side of the source gas. For this reason, even when the source gas of the upstream side flows on the downstream side, and an amount of source gas of the downstream side is increased, the source gas can be pressed on the substrate surface, thereby forming a thin film having uniform film quality.

In the photo-assisted CVD apparatus according to the present invention, a shielding plate can be arranged between a light-receiving window and the discharge electrodes. In this manner, even when the discharge electrodes are sputtered during removal of a deposit, the sputtered material of the discharge electrodes can be prevented from being deposited on the light-receiving window. Therefore, a decrease in transmittance of the light-receiving window can be prevented.

In the photo-assisted CVD apparatus according to the present invention, an exhaust port can be formed at the central portion of the reaction chamber, and a source gas feed means can be formed around the exhaust port. In this case, the transport distance of a source gas can be shortened to be equal to the distance between the source gas feed means and the exhaust port. For this reason, variations in film thickness and variations in film characteristics caused by a long transport distance of the source gas can be prevented. Therefore, even when a plurality of substrates or a substrate having a large area is used, thin films each having a uniform film thickness and uniform film properties can be formed.

In addition, in the photo-assisted CVD apparatus according to the present invention, discharge electrodes can be arranged in the reaction chamber to cover the light-receiving window. In this manner, the light-receiving window is not etched in the step of removing a deposit. Therefore, trouble in film formation caused by the step of removing a deposit can be prevented.

various embodiments of the present invention will be described below with reference to the accompanying drawings.

Figure 3:
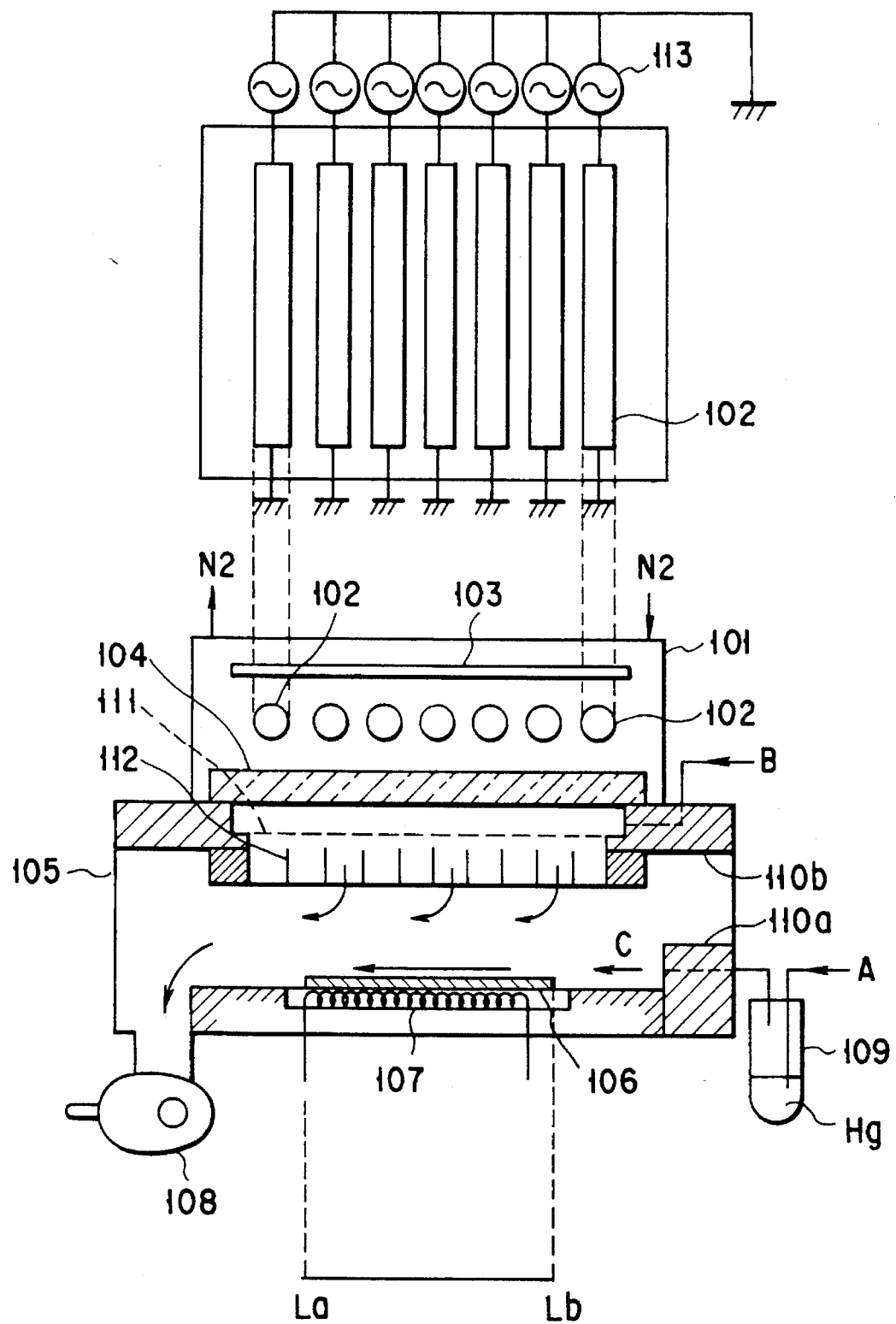
FIG. 3 is a schematic view showing the arrangement of a photo-assisted CVD apparatus according to the first embodiment of the present invention.

FIG. 3 is a schematic view showing the arrangement of a laminar flow type photo-assisted CVD apparatus using a mercury sensitization method according to the first embodiment of the present invention.

In FIG. 3, a target substrate 106 is placed inside a reaction chamber 105. The target substrate 106 is heated by a heater 107. A lamp house 101 is arranged above the reaction chamber 105. Seven ultraviolet sources 102 constituted by low-pressure mercury lamps are arranged in the lamp house 101, and the ultraviolet sources 102 are connected to seven power supplies 113, respectively. With this arrangement, the discharge emissions of the seven ultraviolet sources 102 can be independently controlled. An $N_2$ gas is fed into the lamp house 101 as a purge gas to prevent attenuation of ultraviolet rays caused by the light absorption of atmospheric components (oxygen gas, water vapor, and the like).

A reflection plate 103 is arranged above the ultraviolet sources 102. Light emitted from the ultraviolet sources 102 is directly radiated on the target substrate 106 through a light-receiving window 104 consisting of quartz or the like, or is reflected from the reflection plate 103 and radiated on the target substrate 106 through the light-receiving window 104.

A gas flow control plate 112 consisting of a material transparent to ultraviolet rays, e.g., quartz, is arranged below the ultraviolet sources 102. A purge gas feed nozzle plate 111 having a large number of through holes and transparent to ultraviolet rays is arranged between the gas flow control plate 112 and the light-receiving window 104.

A mercury reservoir 109 for storing mercury whose temperature is kept constant, a source gas supply portion (not shown) for storing a source-gas source such as $SiH_4$, a purge gas supply portion (not shown) for storing an inert gas source such as Ar serving as a purge gas, and a gas exhaust portion 108 constituted by a vacuum exhaust pump are arranged outside the reaction chamber 105. A mechanism for mixing a material absorbing ultraviolet rays with the purge gas may also be arranged.

A source gas A supplied from the source gas supply portion is fed into the reaction chamber 105 through the mercury reservoir 109 and a source gas feed nozzle 110a. That is, the source gas A and a mercury vapor flow in the reaction chamber 105.

A purge gas B supplied from the purge gas supply portion is sprayed on the target substrate 106 through a purge gas feed nozzle 110b, the purge gas feed nozzle plate 111, and the gas flow control plate 112. As a result, a gas mixture C of the source gas A and the mercury vapor flows parallelly to the target substrate 106 to form a laminar flow of the gas mixture C near the surface of the target substrate 106 and to form a laminar flow of the purge gas B at portions except for the portion near the surface of the target substrate 6.

A method of forming a silicon thin film using the photo-assisted CVD apparatus arranged as described above will be described below.

A gas in the reaction chamber 105 is exhausted by the gas exhaust portion 108 to decrease the pressure in the reaction chamber 105.

The target substrate 106 is heated by the heater 107, and a monosilane ($SiH_4$) gas serving as the source gas A is fed from the source gas supply portion into the reaction chamber 105 through the mercury reservoir 109, and an Ar gas serving as the purge gas B is fed from the purge gas supply portion into the reaction chamber 105.

The ultraviolet sources 102 are turned on, ultraviolet rays are radiated on the surface of the target substrate 106. At this time, powers applied to the electric sources 113 are determined such that, as shown in FIG. 4, an excited light intensity on the target substrate 106 is exponentially increased from the upstream side (source gas feed side) of the gas mixture (the source gas A and mercury vapor) to the downstream side (source gas exhaust side). Note that reference symbols La and Lb in FIG. 4 indicate the position of the upstream end portion of the target substrate 106 and the position of the downstream end portion of the target substrate 106.

At this time, Hg atoms are excited by ultraviolet rays from the low-pressure mercury lamps, and $SiH_4$ molecules receive energy upon colliding with the excited mercury atoms so as to decompose the $SiH_4$. A decomposition reaction formula in this case is as follows.

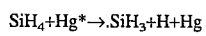

$$SiH_4 + Hg^* \rightarrow .SiH_3 + H + Hg$$

In this formula, Hg* represents excited mercury, $.SiH_3$ represents an $SiH_3$ radical.

The $SiH_3$ radicals produced by the above decomposition reaction process cause the following radical-radical reaction, thereby producing an $SiH_2$ radical.

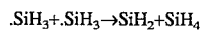

$$.SiH_3 + .SiH_3 \rightarrow SiH_2 + SiH_4$$

In this formula, $.SiH_2$ represents an $SiH_2$ radical.

The number of $SiH_2$ radicals on the target substrate 106 is increased from the upstream side to the downstream side because the above reaction is advanced together with the transport of the $SiH_3$ radicals.

On the other hand, the number of $SiH_3$ radicals on the target substrate 106 is increased from the upstream side to the downstream side because the excited light intensity is exponentially increased from the upstream side to the downstream side.

Therefore, a ratio of the $SiH_2$ radicals to the $SiH_3$ radicals is constant on the target substrate 106, and a silicon thin film having uniform film quality can be obtained.

Figure 6:
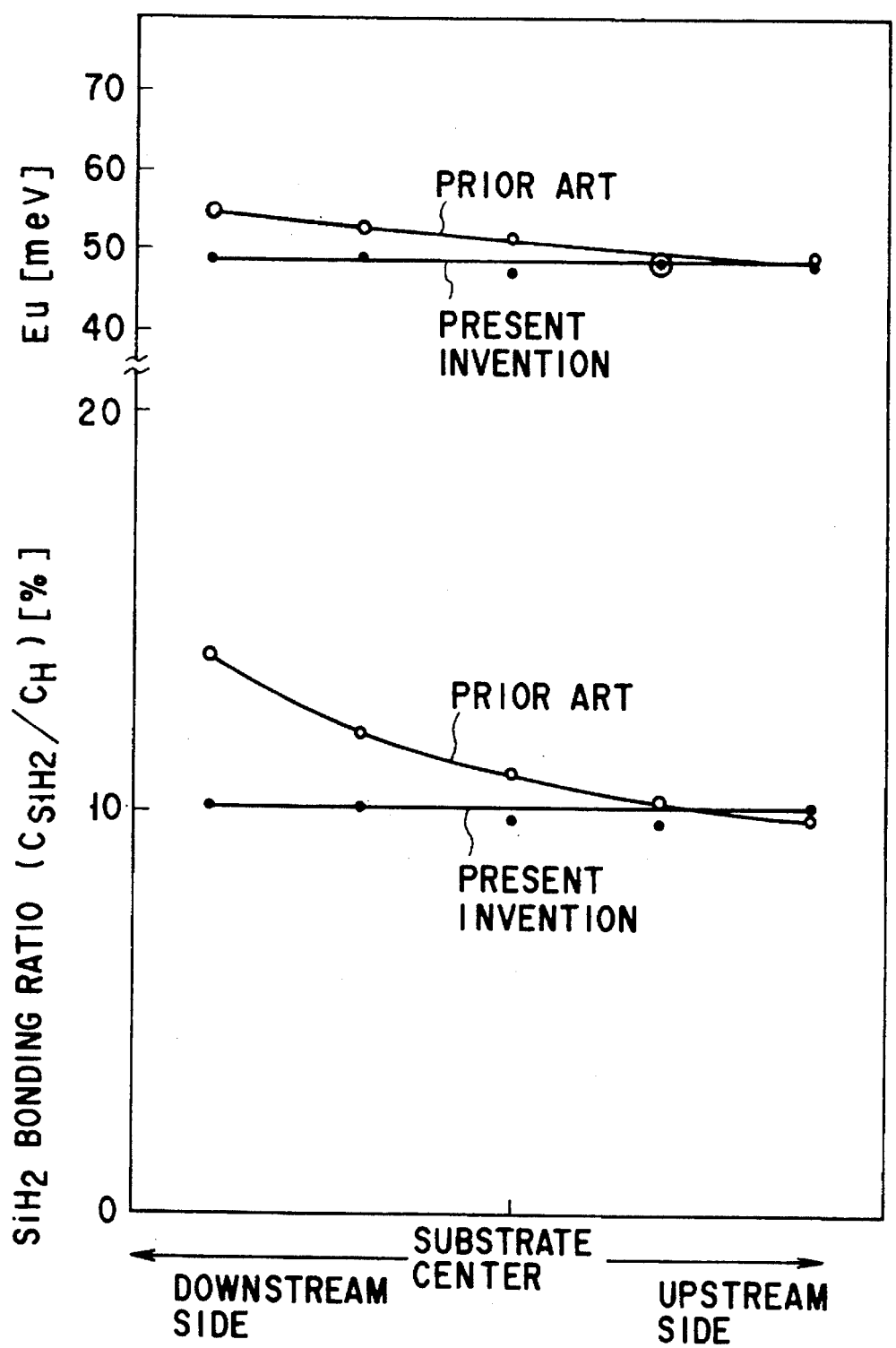
FIG. 6 is a graph for explaining an effect of the present invention.

FIG. 6 is a graph showing the characteristics of a hydrogenated amorphous silicon film formed by using the photo-assisted CVD apparatus according to this embodiment and the characteristics of a hydrogenated amorphous silicon film formed by using the conventional photo-assisted CVD apparatus. A hydrogenated amorphous silicon film is expected to be used as a PSID (Photoconductor layered Solid-state Imaging Device) which is one of solid-state imaging devices for an HDTV (High Definition Television). As the characteristics to be evaluated, $SiH_2$ bonding ratio ($C_a/C_b$: a=$SiH_2$, b=H) which is an index of the bonded state of hydrogen atoms in the hydrogenated amorphous silicon film and an Urbach energy (Eu) which is an index of a tail state (a localized level at a position near a band edge of the film) for controlling after image characteristics of a layered solid-state imaging device are used. As the conventional photo-assisted CVD apparatus, a photo-assisted CVD apparatus having the arrangement shown in FIG. 1 is selected. That is, the ultraviolet source 102a in which an excited light intensity distribution is almost uniform on the target substrate 106 as shown in FIG. 5 is used.

As is apparent from the graph in FIG. 6, according to the photo-assisted CVD apparatus of the present invention, an $SiH_2$ bonding ratio and an Urbach energy are uniform on the substrate. On the other hand, according to the conventional photo-assisted CVD apparatus, it is found that an $SiH_2$ bonding ratio and an Urbach energy are increased toward the downstream side. This phenomenon will be explained as follows.

In the conventional photo-assisted CVD apparatus shown in FIG. 1, unlike the photo-assisted CVD apparatus of the present invention shown in FIG. 3, the number of $SiH_3$ radicals is constant at any position because an excited light intensity distribution is almost uniform on the target substrate 106. However, as $SiH_3$ radicals produced on the upstream side are transported, $SiH_2$ radicals are produced by the above radical reaction. For this reason, the number of $SiH_2$ radicals on the target substrate 106 is increased toward the downstream. As a result, the bonded state of hydrogen atoms and the bonded state of silicon atoms in the hydrogenated amorphous silicon film formed on the upstream side are different from those in the hydrogenated amorphous silicon film formed on the downstream side. For this reason, a hydrogenated amorphous silicon film in which the number of $SiH_2$ bonds is large and fluctuations in the bonded state of silicon atoms frequently occur is formed on the downstream side, and the film having nonuniform in film quality is formed.

According to this embodiment, a ratio of $SiH_2$ radicals to $SiH_3$ radicals is constant on the target substrate 106 because an excited light intensity on the target substrate 106 is exponentially increased toward the downstream. As a result, a silicon film having uniform film quality can be obtained. Therefore, when a hydrogenated amorphous silicon film serving as a photo-conductive film for a PSID is formed by the photo-assisted CVD apparatus of this embodiment, unlike a hydrogenated amorphous silicon film formed by the conventional photo-assisted CVD apparatus, the after image characteristics on the downstream side of the source gas flow are not inferior to those of the upstream side of the source gas flow.

The same reference numerals as in FIG. 3 denote the same parts in the drawings which are referred to in the descriptions of the second to twenty-fourth embodiments, and a detailed description thereof will be omitted.

Figure 7:
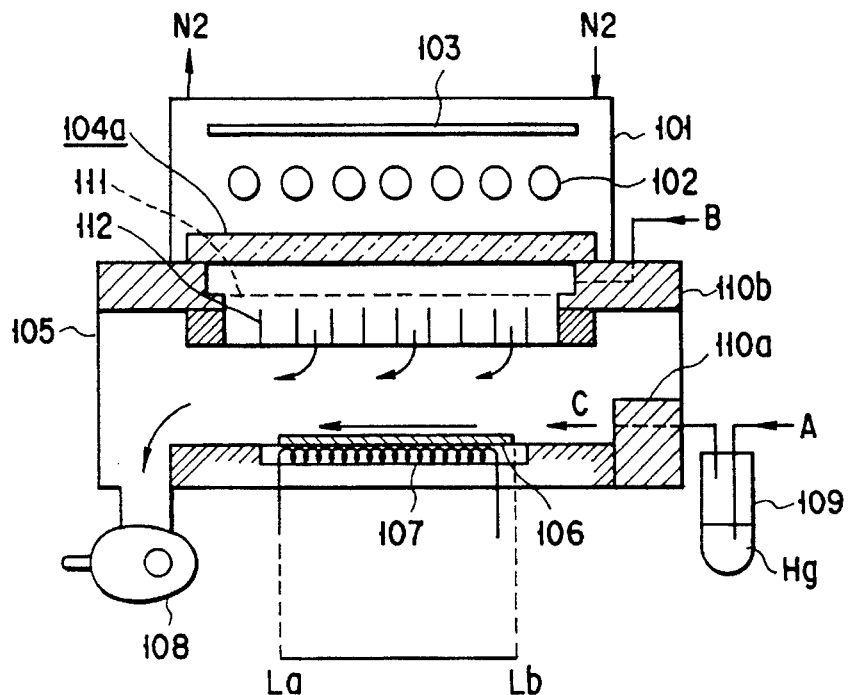
FIG. 7 is a schematic view showing the arrangement of a photo-assisted CVD apparatus according to the second embodiment of the present invention.

FIG. 7 is a schematic view showing the arrangement of a laminar flow type photo-assisted CVD apparatus using a mercury sensitization method according to the second embodiment of the present invention.

The photo-assisted CVD apparatus of this embodiment is different from the photo-assisted CVD apparatus of the embodiment shown in FIG. 3 in that a light intensity on a target substrate 106 is exponentially increased from an upstream side to a downstream side by using a light-receiving window 104a in place of using the plurality of ultraviolet sources 102.

Figure 8A:
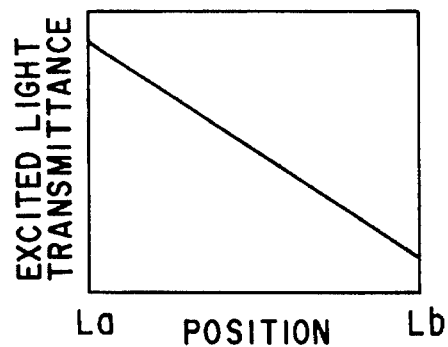
FIGS. 8A to 8C are graphs showing relationships between substrate positions and excited light intensities in the photo-assisted CVD apparatus in FIG. 7.

That is, the light-receiving window 104a is formed such that, as shown in FIG. 8A, an ultraviolet transmittance is exponentially increased toward the flow direction of a gas mixture C in a excited light transmittance distribution of the surface of the light-receiving window 104a.

Figure 8C:
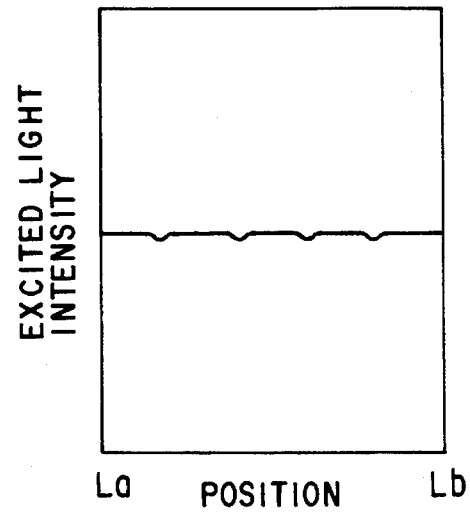
Figure 8B:
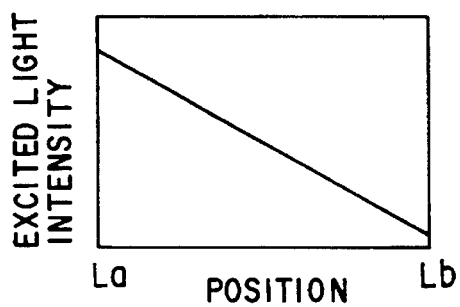

According to the photo-assisted CVD apparatus arranged as described above, although an excited light intensity immediately below ultraviolet sources 102 is almost uniform as shown in FIG. 8C, an excited light intensity is exponentially increased from the upstream side to the downstream side of the gas mixture C as shown in FIG. 8B. For this reason, as in the above-described embodiment, a film having uniform film quality can be formed on the target substrate 106.

Figure 9:
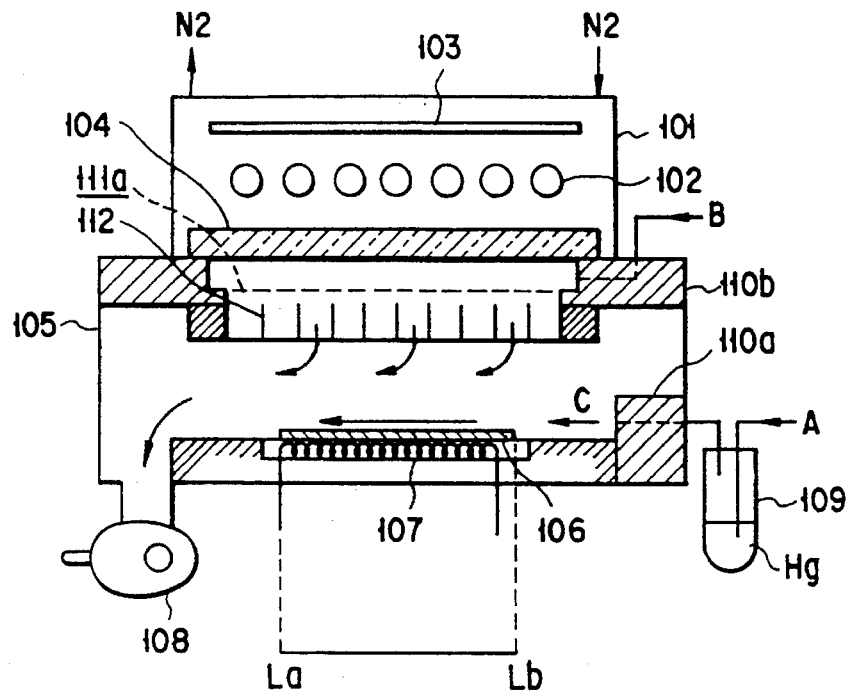
FIG. 9 is a schematic view showing the arrangement of a photo-assisted CVD apparatus according to the third embodiment of the present invention.

FIG. 9 is a schematic view showing a laminar flow type photo-assisted CVD apparatus using a mercury sensitization method according to the third embodiment of the present invention.

The photo-assisted CVD apparatus of this embodiment is different from the photo-assisted CVD apparatus according to the first embodiment in that a light intensity on a target substrate 106 is exponentially increased from an upstream side to a downstream side by using a purge gas feed nozzle plate 111a in place of using a plurality of ultraviolet sources 102.

Figure 10A:
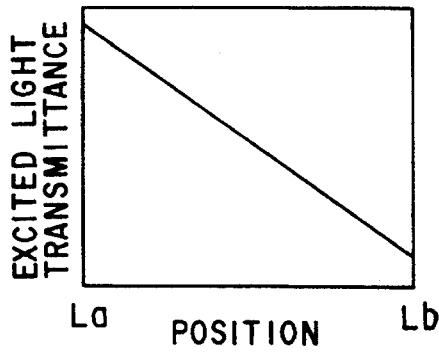
FIGS. 10A to 10C are graphs showing relationships between substrate positions and excited light intensities in the photo-assisted CVD apparatus in FIG. 9.

That is, the purge gas feed nozzle plate 111a is formed such that, as shown in FIG. 10A, an ultraviolet transmittance is exponentially increased toward the flow direction of a gas mixture C in a excited light transmittance distribution of the surface of the purge gas feed nozzle plate 111a.

Figure 10C:
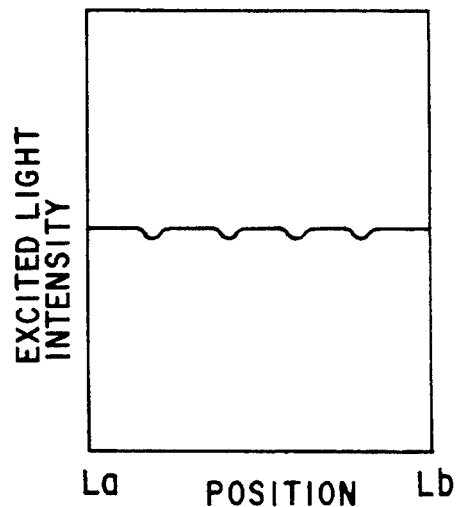
Figure 10B:
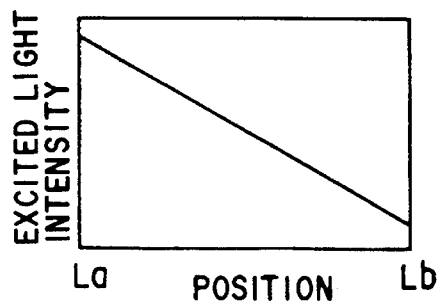

In the photo-assisted CVD apparatus arranged as described above, although an excited light intensity immediately below ultraviolet sources 102 as shown in FIG. 10C, an excited light intensity is exponentially increased from the upstream side to the downstream side of the gas mixture C as shown in FIG. 10B. For this reason, as in the above described embodiment, a film having uniform film quality can be formed on the target substrate 106.

Figure 11:
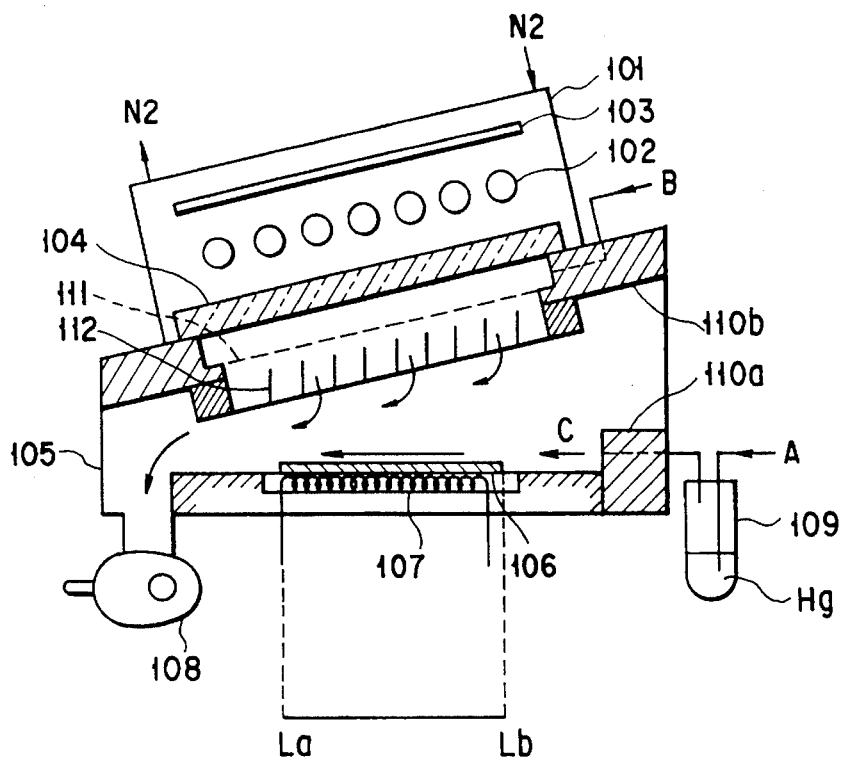
FIG. 11 is a schematic view showing the arrangement of a photo-assisted CVD apparatus according to the fourth embodiment of the present invention.

FIG. 11 is a schematic view showing a laminar flow type photo-assisted CVD apparatus using a mercury sensitization method according to the fourth embodiment of the present invention.

The photo-assisted CVD apparatus of this embodiment is different from the photo-assisted CVD apparatus according to the first embodiment shown in FIG. 3 in that the overall upper portion of a reaction chamber 105 is inclined such that the distance between a purge gas feed nozzle plate 111 and a target substrate 106 is exponentially decreased from the upstream side to the downstream side of a gas mixture C.

Figure 12A:
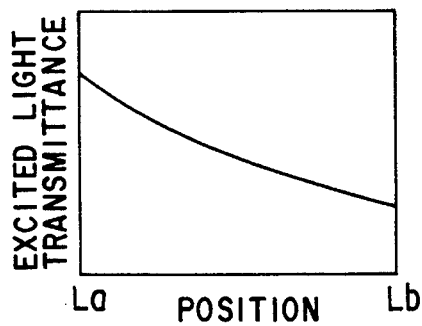
FIGS. 12A to 12C are graphs showing relationships between substrate positions and excited light intensities in the photo-assisted CVD apparatus in FIG. 11.
Figure 12B:
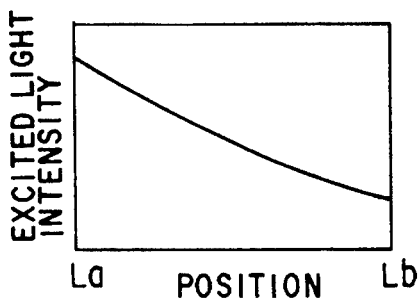
Figure 12C:
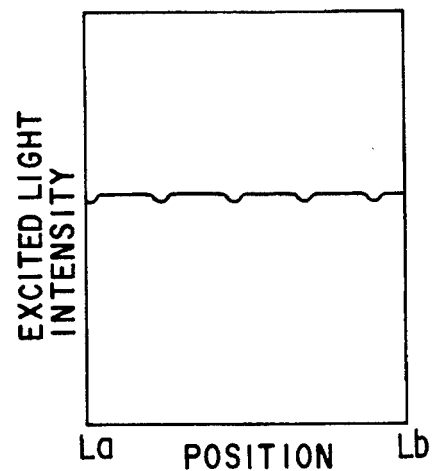

According to the photo-assisted CVD apparatus arranged as described above, the length of a space for absorbing ultraviolet rays is decreased from the upstream side of the gas mixture C to the downstream side thereof. For this reason, although an excited light intensity immediately below ultraviolet sources 102 is almost uniform as shown in FIG. 12C, an excited light transmittance in a space for decomposing a source gas is exponentially increased from the upstream side of the gas mixture C to the downstream side thereof. A position at which the decomposition reaction of $SiH_4$ serving as the source gas is performed by ultraviolet rays in the downstream side of the gas mixture C is closer to the target substrate 106 than a position at which the decomposition reaction of $SiH_4$ serving as the source gas is performed by ultraviolet rays in the upstream side of the gas mixture C. For this reason, the number of $SiH_2$ radicals produced by a radical-radical reaction caused by transport of $SiH_3$ radicals which are produced by the decomposition reaction is decreased, a ratio of the $SiH_2$ radicals to the $SiH_3$ radicals ($SiH_2$ radicals/$SiH_3$ radicals) is decreased toward the downstream side of the gas mixture C.

Therefore, as in the above embodiment, a film having uniform film quality can be formed on the target substrate 106.

Figure 13:
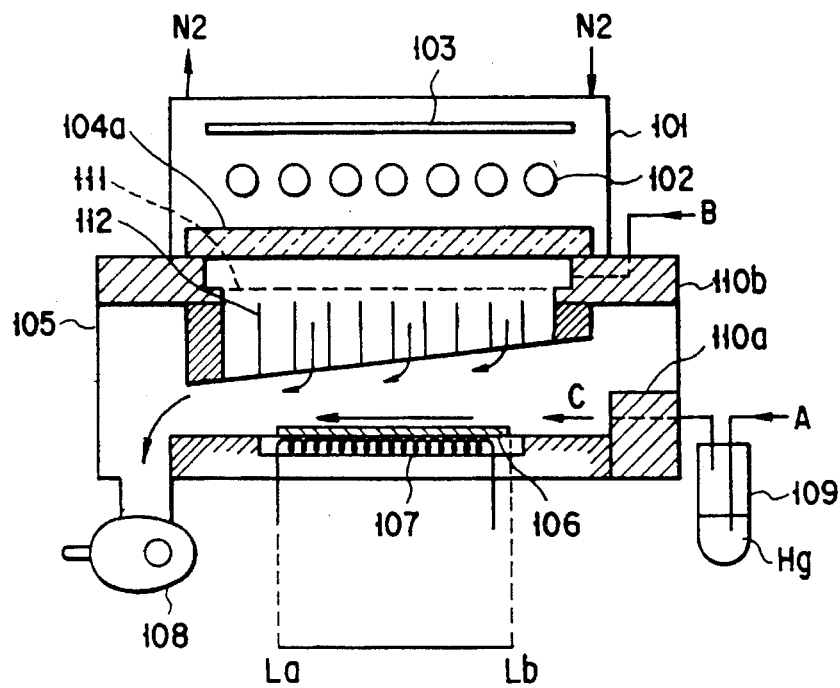
FIG. 13 is a schematic view showing the arrangement of a photo-assisted CVD apparatus according to the fifth embodiment of the present invention.

FIG. 13 is a schematic view showing a laminar flow type photo-assisted CVD apparatus using a mercury sensitization method according to the fifth embodiment of the present invention.

The photo-assisted CVD apparatus of this embodiment is different from the photo-assisted CVD apparatus of the fourth embodiment shown in FIG. 11 in that a gas flow control plate 112 has a horizontal upper surface and an inclined lower surface in place of the overall inclined upper portion of the reaction chamber 105, such that the distance between a purge gas feed nozzle plate 111 and a target substrate 106 is exponentially decreased from the upstream side of a gas mixture C to the downstream side thereof.

Figure 14A:
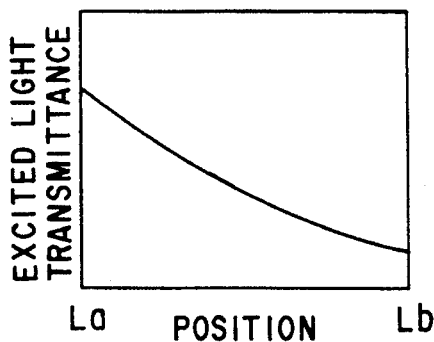
FIGS. 14A to 14C are graphs showing relationships between substrate positions and excited light intensities in the photo-assisted CVD apparatus in FIG. 13.
Figure 14B:
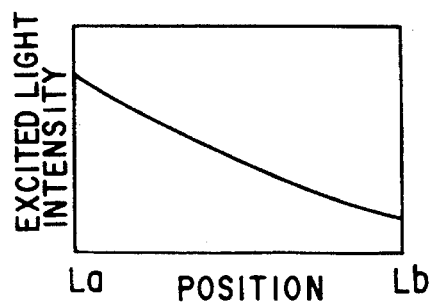
Figure 14C:
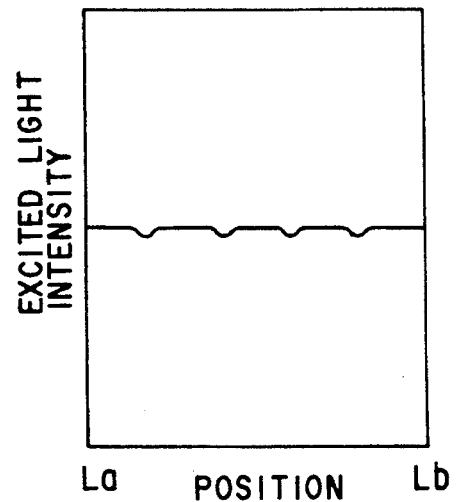

In the photo-assisted CVD apparatus arranged as described above, as shown in FIG. 14A, an excited light transmittance of a space for decomposing a source gas is exponentially increased in the flow direction of the gas mixture C. For this reason, although an excited light intensity immediately below ultraviolet sources 102 is almost uniform as shown in FIG. 10C, the excited light intensity is exponentially increased from the upstream side of the gas mixture C to the downstream side thereof. Therefore, as in the above embodiment, a film having uniform film quality can be formed on the target substrate 106. In this embodiment, although the length of the gas flow control plate 112 is increased from the upstream side of the gas mixture C to the downstream side thereof, the length remain the same.

In the first to fifth embodiments described above, the laminar flow type photo-assisted CVD apparatuses have been described. The present invention can be applied to a photo-assisted CVD apparatus other than the laminar flow type photo-assisted CVD apparatus.

In the first to fifth embodiments, although the photo-assisted CVD method using a mercury sensitization as an excitation method has been described, the present invention can be applied to another excitation method such as a photo-assisted CVD method using a direct excitation method using a Xe lamp and $SiH_4$ and a photo-assisted CVD method using a direct excitation method using a low-pressure mercury lamp and $Si_2H_6$.

FIGS. 15A and 15B are schematic views showing the arrangement of a photo-assisted CVD apparatus according to the sixth embodiment of the present invention, in which FIG. 15A is the schematic view of the arrangement when viewed from the upper direction, and FIG. 15B is a schematic view of the arrangement when viewed from the side surface.

A target substrate 206 is placed inside a reaction chamber 205, and a heater 207 for heating the target substrate 206 is arranged inside the reaction chamber 205. A cleaning discharge electrode 214 (discharge electrode for removing a deposit) connected to a high-frequency power supply 215 (13.56 MHz) is arranged above the target substrate 206. The shape of the cleaning discharge electrode 214 has a rectangular outline to surround the space above the target substrate 206. For this reason, the cleaning discharge electrode 214 does not interfere with film formation. Note that the inner wall of the reaction chamber 205 is grounded.

A lamp house 201 is arranged above the reaction chamber 205. An $N_2$ gas serving as a purge gas is fed into the lamp house 201.

An ultraviolet source 202 is arranged in the lamp house 201, and a reflection plate 203 is arranged above the ultraviolet source 202. Rays emitted from the ultraviolet source 202 are radiated on the target substrate 206 through a light-receiving window 204, or reflected from the reflection plate 203 and radiated on the target substrate 206 through the light-receiving window 204. On the other hand, a gas flow control plate 212 is arranged below the ultraviolet source 202. A mesh type purge gas feed nozzle plate 211 is arranged between the gas flow control plate 212 and the light-receiving window 204.

A mercury reservoir 209 for storing mercury whose temperature is kept constant, a source gas supply portion (not shown) for storing a source gas such as $SiH_4$, a purge gas supply portion (not shown) for storing an inert gas consisting of an inert material such as Ar, an etching gas supply portion (not shown), and a gas exhaust portion 208 constituted by a vacuum exhaust pump are arranged outside the reaction chamber 205. The source gas supplied from the source gas supply portion is supplied into the reaction chamber 205 through the mercury reservoir 209 and a source gas feed nozzle 210a. That is, a source gas A and a mercury vapor flow in the reaction chamber 205.

The purge gas supplied from the purge gas supply portion is sprayed on the surface of the target substrate 106 through a purge gas feed nozzle 210b arranged near an end portion of the light-receiving window 204, the purge gas feed nozzle plate 211, and the gas flow control plate 212. The purge gas feed nozzle plate 211 and the gas flow control plate 212 are arranged to increase a purge effect. As a result, a gas mixture of the source gas and the mercury vapor flows parallelly to the target substrate 206 to form a laminar flow of the gas mixture near the surface of the target substrate 206 and to form a laminar flow of the purge gas at portions except for the portion near the surface of the target substrate 206.

A method of forming a hydrogenated amorphous silicon film using the photo-assisted CVD apparatus arranged as described above will be described below.

A gas in the reaction chamber 205 is exhausted by the gas exhaust portion 208 to decrease the pressure in the reaction chamber 205.

The target substrate 206 is heated to a temperature of 230° C. with the heater 207, and an $SiH_4$ gas serving as the source gas is fed from the source gas supply portion into the reaction chamber 205 through the mercury reservoir 209. An Ar gas serving as the purge gas is fed from the purge gas supply portion into the reaction chamber 205.

The ultraviolet source 202 is turned on, ultraviolet rays are radiated on the surface of the target substrate 206.

At this time, Hg atoms are excited by ultraviolet rays from the low-pressure mercury lamps, and $SiH_4$ receives energy upon colliding with the excited mercury atoms and is decomposed, thereby producing $SiH_3$ radicals serving as a species for forming a film. The $SiH_3$ radicals produced as described above are deposited on the target substrate 206 to form a hydrogenated amorphous hydride film.

A method of removing a hydrogenated amorphous silicon film deposited on the inside the reaction chamber 205 during the film formation will be described below.

First, the target substrate 206 is picked from the reaction chamber 205, an etching gas, e.g., an $SF_6$ gas, is fed into the reaction chamber 205 at 100 SCCM. This etching gas is fed from the source gas feed nozzle 210a as in a case of feeding the source gas. At this time, a purge gas, e.g., an Ar gas, is fed from the purge gas feed nozzle 210b at 4.5 SLM as in formation of a thin film to prevent etching or corrosion of the light-receiving window 204. A pressure in the reaction chamber 205 is decreased to 0.5 Torr with the gas exhaust portion 208, and the temperature of the heater 207 is set at a level equal to that of formation of a thin film. An RF power of e.g., 200 W is applied to the cleaning discharge electrode 214. As a result, a plasma discharge region is formed between the cleaning discharge electrode 214 and the inner wall of the target substrate 206, and the $SF_6$ serving as the etching gas is decomposed to produce F radicals serving as an etching species. The hydrogenated amorphous silicon film deposited on the inside of the reaction chamber 205 is etched by the F radicals.

Figure 2A:
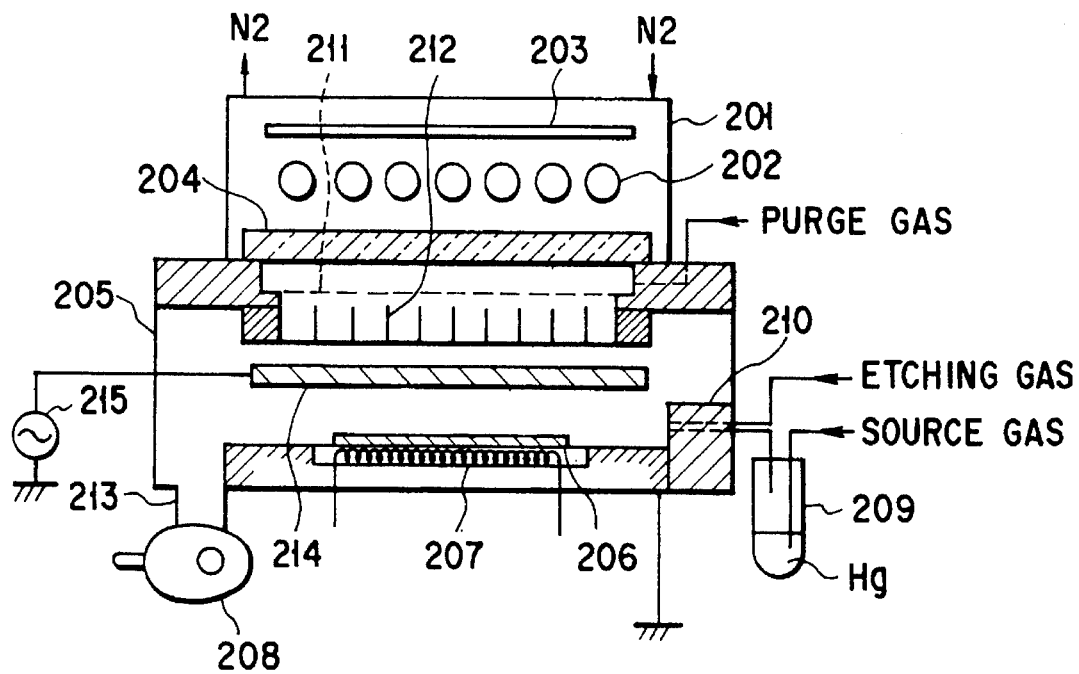
FIG. 2A is a schematic view showing the arrangement of another conventional photo-assisted CVD apparatus.
Figure 2B:
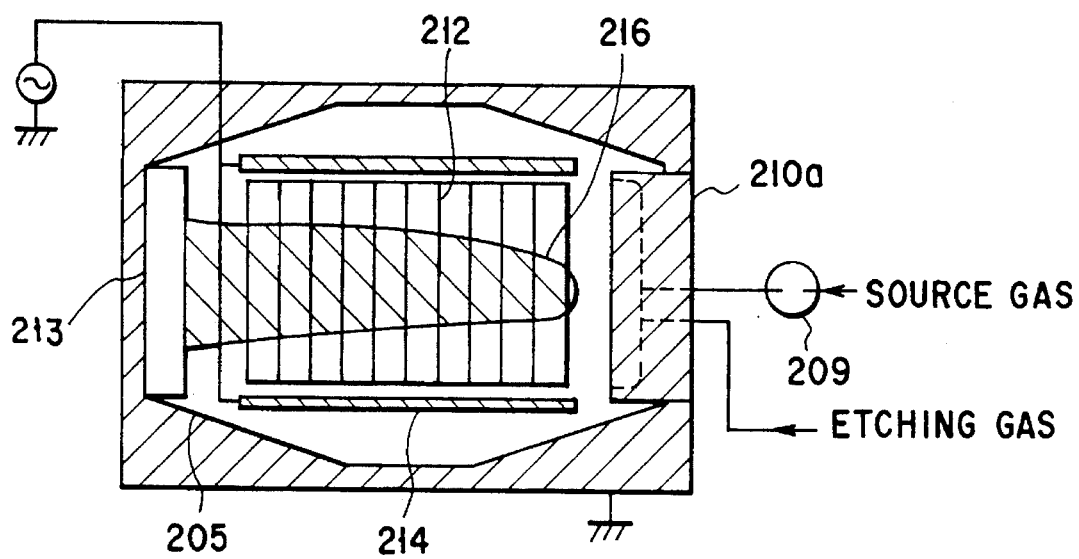
FIG. 2B is a view showing the arrangement of electrodes of the photo-assisted CVD apparatus shown in FIG. 2A.
Figure 16A:
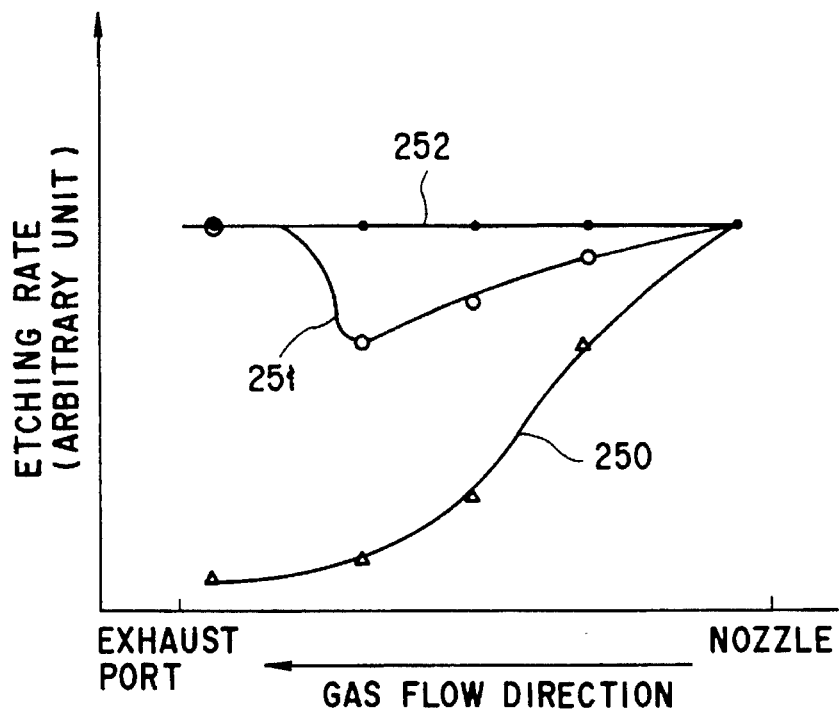
FIGS. 16A and 16B are graphs showing relationships between substrate positions and etching rates in the photo-assisted CVD apparatus in FIGS. 15A and 15B and in the conventional photo-assisted CVD apparatus.
Figure 16B:
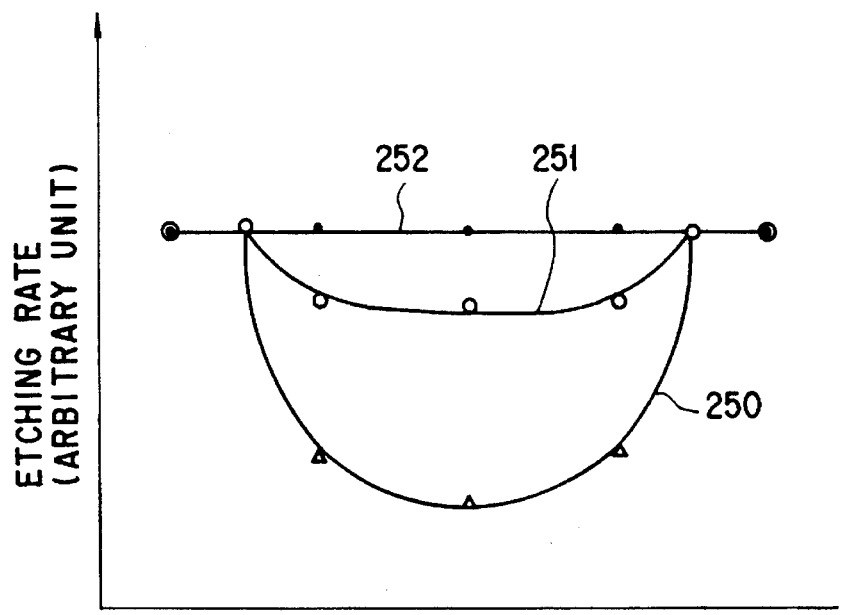

FIGS. 16A and 16B are graphs showing the measurement results of etching rates. FIG. 16A shows an etching rate in the flow direction of an etching gas, and FIG. 16B shows an etching rate in the direction perpendicular to the flow of the etching gas. In these graphs, a curve 251 indicates the measurement result of this embodiment, a curve 250 indicates the measurement result of the conventional photo-assisted CVD apparatus as shown in FIGS. 2A and 2B.

As is apparent from the graphs of FIGS. 16A and 16B, in the conventional photo-assisted CVD apparatus, an etching rate is abruptly decreased from the source gas feed nozzle 210a to an exhaust port 213, and the etching rate is considerably decreased at the central portion on the target substrate 206.

On the other hand, in the photo-assisted CVD apparatus of this embodiment, an etching rate is decreased from the source gas feed nozzle 210a to the exhaust port 213 to some extent, but is not abruptly decreased. The etching rate is suppressed to be low at the central portion on the target substrate 206.

The above measurement results are obtained because of the following reason.

A plasma discharge region is mainly formed in a region around the cleaning discharge electrode 214. For this reason, in the conventional photo-assisted CVD apparatus, a plasma discharge region near the source gas feed nozzle 210a and the exhaust port 213 is narrow. Therefore, the number of radicals is decreased from the source gas feed nozzle 210a to the exhaust port 213, and the etching rate is decreased accordingly. In addition, when position comes close to the central portion on the target substrate 206, this position is away from the cleaning discharge electrode 214. For this reason, an etching rate is decreased toward the central portion.

A removal efficiency is rate-determined due to the presence of a region 216 (FIG. 2B) having a low etching rate, and a throughput is decreased. The etching rate is thus decreased because transport of radicals is performed by self-diffusion caused by a concentration difference in the reaction chamber 205.

On the other hand, in this embodiment, the shape of the cleaning discharge electrode 214 is a closed loop shape, and is arranged to surround the target substrate 206. For this reason, a large plasma discharge region is formed near the source gas feed nozzle 210a and the exhaust port 213. More specifically, the plasma discharge region is also formed near the source gas feed nozzle 210a because the cleaning discharge electrode 214 is present near the source gas feed nozzle 210a to cross the flow of a source gas. For this reason, radicals produced in the plasma discharge region near the source gas feed nozzle 210a are transported to the central portion on the target substrate 206 and the exhaust port 213 by the flow of an etching gas.

That is, the area of the plasma discharge region in the reaction chamber 205 is increased, and radicals are transported by not only self-diffusion but also the flow of the etching gas. As a result, the reaction chamber 205 can be efficiently filled with radicals, and the measurement results as described above are obtained.

The light-receiving window 204 is not etched upon etching the deposit because the etching gas is pressed on the target substrate 206 by the purge gas. For this reason, a decrease in film forming rate caused by a decrease in transmittance of the light-receiving window 204 can be prevented. Therefore, according to this embodiment, a removal efficiency is increased, and a decrease in film forming rate can be prevented, thereby increasing a throughput.

Figure 17A:
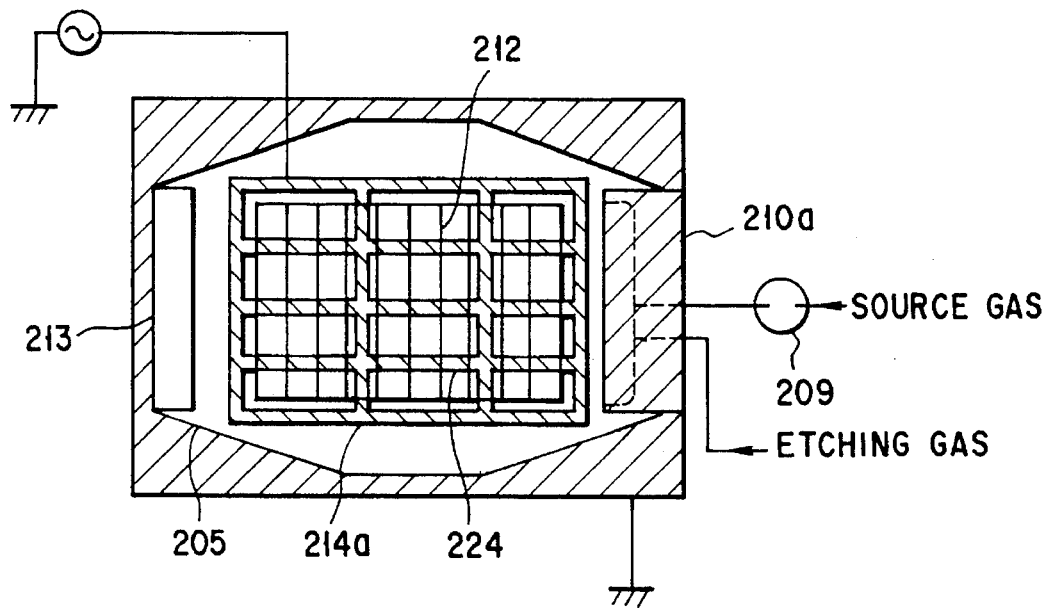
FIGS. 17A and 17B are schematic views showing the arrangement of a photo-assisted CVD apparatus according to the seventh embodiment of the present invention.
Figure 17B:
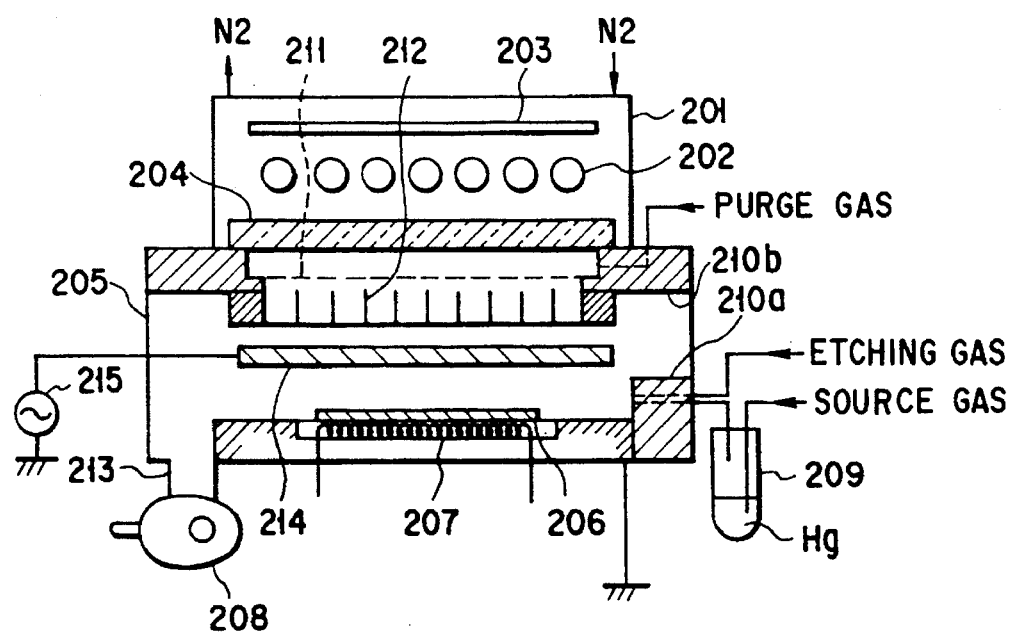

FIGS. 17A and 17B are schematic views showing the arrangement of a photo-assisted CVD apparatus according to the seventh embodiment of the present invention, in which FIG. 17A is the view of the arrangement when viewed from the upper surface, and FIG. 17B is the view of the arrangement when viewed from the side surfaces.

A different point between the photo-assisted CVD apparatus of this embodiment and the photo-assisted CVD apparatus according to the embodiment shown in FIGS. 15A and 15B is the shape of a cleaning discharge electrode 214a. That is, the cleaning discharge electrode 214a has an arrangement obtained by adding a lattice-like electrode 224 in the cleaning discharge electrode 214 of the photo-assisted CVD apparatus shown in FIGS. 15A and 15B.

When the cleaning discharge electrode 214a is used, radicals are produced even in a region having a low etching rate in the photo-assisted CVD apparatus shown in FIGS. 15A and 15B. As a result, an etching rate indicated by curves 252 in FIGS. 16A and 16B is obtained. That is, an etching rate is almost uniformed in the reaction chamber 205. Therefore, a cleaning time is considerably shortened, and a throughput is increased.

In the sixth and seventh embodiments, although the $SF_6$ gas is used as the etching gas, a gas mixture of an $SF_6$ gas and an $O_2$ gas may be used. In this case, S compounds produced during the step of removing a deposit can be effectively removed. As another etching gas, an F-based gas (an $NF_3$ gas, an $F_2$ gas, or a $CF_4$ gas) or a gas mixture of such an F-based gas and another gas may be used.

In the sixth and seventh embodiments, the photo-assisted CVD apparatuses using a mercury sensitization method has been described. The present invention can also be applied to a photo-assisted CVD apparatus using a direct excitation method using an $Si_2H_6$ gas as a source gas.

In the sixth and seventh embodiments, a method of forming a hydrogenated amorphous silicon thin film has been described. The present invention can be applied to a method of forming another thin film, e.g., a silicon compound thin film such as a silicon nitride film, a silicon carbide film, or a silicon germanium film, and a method of forming a thin film of a compound containing $Ta_2O_5$, Ti, W, or Mo other than silicon.

Figure 18:
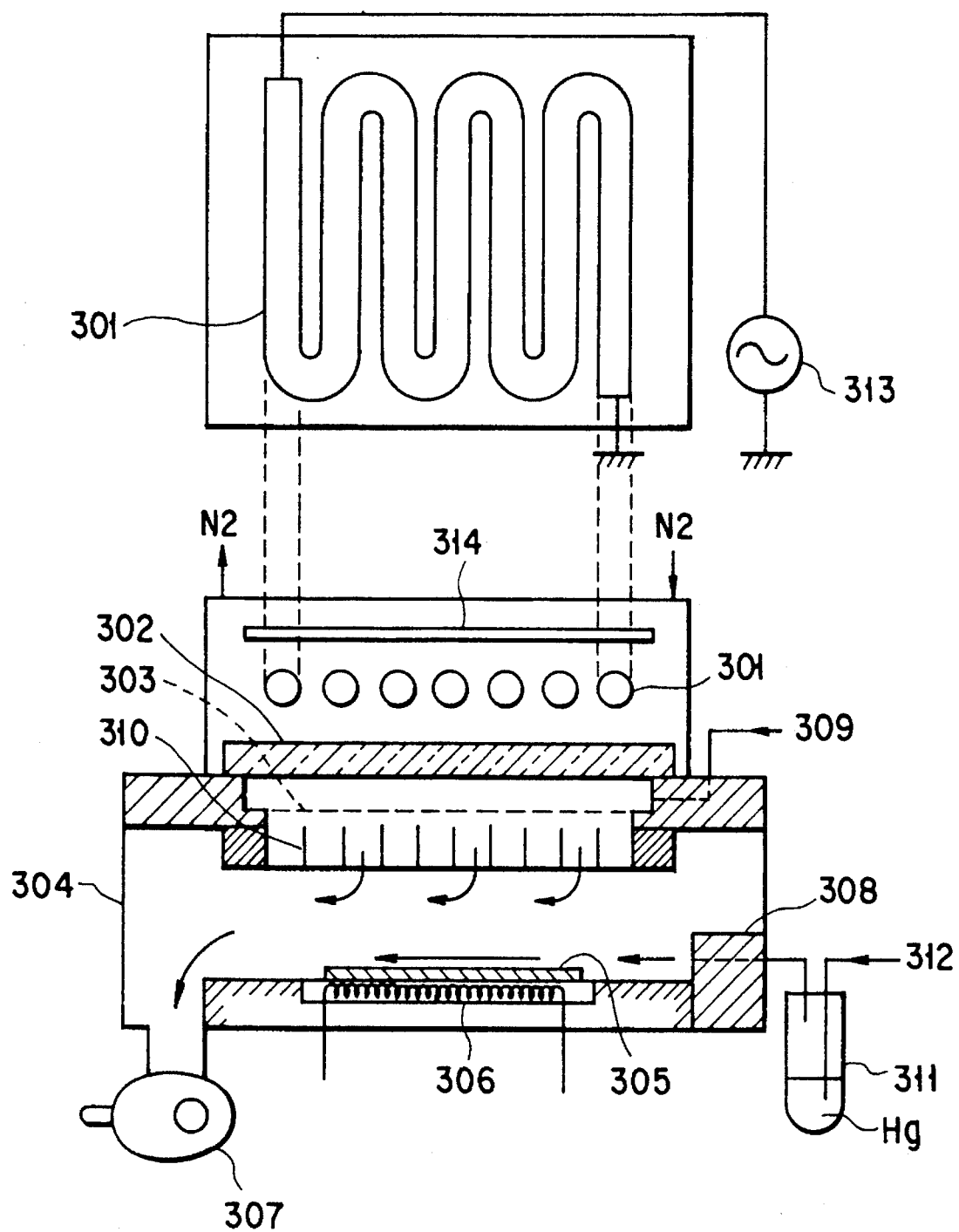
FIG. 18 is a schematic view showing the arrangement of a laminar flow type photo-assisted CVD apparatus according to the eighth embodiment of the present invention.

FIG. 18 is a schematic view showing the arrangement of a laminar flow type photo-assisted CVD apparatus according to the eighth embodiment of the present invention.

A target substrate 305 is stored inside the reaction chamber 304. The target substrate 305 is heated by a heater 306. A lamp house 315 is arranged above the reaction chamber 304. An ultraviolet source 301 constituted by a single low-pressure mercury lamp is arranged inside the lamp house 315. The ultraviolet source 301 is connected to a power supply 313, and the ultraviolet source 301 is larger than the target substrate 305 by one size. An $N_2$ gas is fed from one end of the lamp house 315.

A reflection plate 314 is arranged above the ultraviolet source 301. A light-receiving window 302, a transparent nozzle plate 303, a gas flow control plate 310 are sequentially arranged below the ultraviolet source 301. The light-receiving window 302, the transparent nozzle plate 303, and the gas flow control plate 310 consist of a material, e.g., synthetic quartz, transparent to ultraviolet rays. In the surface of the transparent nozzle plate 303, an ultraviolet transmittance at a central portion is higher than that at a peripheral portion. The above ultraviolet transmittance distribution is obtained such that the central portion of the transparent nozzle plate 303 is coated with a thin film by sputtering a metal or coating a resist during the formation of the transparent nozzle plate 303.

Ultraviolet rays emitted from the ultraviolet source 301 are directly radiated on the target substrate 305 through the light-receiving window 302, the transparent nozzle plate 303, and the gas flow control plate 310, or reflected from the reflection plate 314 and radiated on the target substrate 305 through the light-receiving window 302, the transparent nozzle plate 303, and the gas flow control plate 310.

A mercury reservoir 311 for storing mercury whose temperature is kept constant, a source gas supply portion (not shown) for storing a source gas such as $SiH_4$, a purge gas supply portion (not shown) for storing an inert gas such as Ar serving as a purge gas, and a gas exhaust portion 307 constituted by a mechanical booster pump or the like are arranged outside the reaction chamber 304.

A source gas 312 supplied from the source gas supply portion is fed into the reaction chamber 304 through the mercury reservoir 311 and a source gas feed nozzle 308a. That is, the source gas 312 and a mercury vapor flow in the reaction chamber 304.

A purge gas feed nozzle 308b is arranged at the lower end portion of the light-receiving window 302. A purge gas 309 is supplied by the purge gas feed nozzle 308b and the purge gas supply portion into the space between the light-receiving window 302 and the transparent nozzle plate 303, and the purge gas 309 is blown on the target substrate 305 through the transparent nozzle plate 303 and the gas flow control plate 310. As a result, a gas mixture of the source gas 312 and the mercury vapor flows parallelly to the target substrate 305 to form a laminar flow of the gas mixture near the surface of the target substrate 305 and to form a laminar flow of the purge gas 309 at portions except for the portion near the surface of the target substrate 305.

A method of forming a silicon thin film using the photo-assisted CVD apparatus arranged as described above will be described below.

A gas in the reaction chamber 304 is exhausted by the gas exhaust portion 307 to set the pressure in the reaction chamber 304 to 0.2 Torr or less, and the target substrate 305 is heated by the heater 306 to a temperature of about 200° to 300° C.

The $SiH_4$ gas serving as the source gas 312 diluted with an Ar carrier gas is fed into the reaction chamber 304 through the mercury reservoir 311 and the source gas feed nozzle 308a under the condition of a total flow rate of 0.5 SLM or more. An Ar gas is fed as a purge gas from the purge gas feed nozzle 308b at a flow rate of 4.0 SLM or more to be supplied into the space between the light-receiving window 302 and the transparent nozzle plate 303. The purge gas 309 is uniformed by the transparent nozzle plate 303 and the gas flow control plate 310 to be blown on the surface of the target substrate 305.

The ultraviolet source 301 is set such that an ultraviolet illuminance on the target substrate 305 is set to be 15 $mW/cm^2$ at a wavelength 254 nm, and the ultraviolet rays are radiated on the surface of the target substrate 305. A film forming rate of 15 nm/min is obtained under this illuminance condition. As a result, Hg atoms are excited with the ultraviolet rays from the low-pressure mercury lamp, and the $SiH_4$ gas receives an energy upon colliding with the excited Hg atoms and is decomposed to produce $SiH_3$ radicals serving as a film forming species. The $SiH_3$ radicals produced as described above are deposited on the target substrate 305 to form an amorphous silicon thin film.

When the amorphous silicon thin film formed as described above was examined, the thickness of the amorphous silicon thin film was uniform on the target substrate 305 unlike that of an amorphous silicon thin film formed by the conventional photo-assisted CVD apparatus.

A reason for this result will be described as follows. In the conventional photo-assisted CVD apparatus, since the ultraviolet transmittance of the transparent nozzle is constant, the illuminance of ultraviolet rays at the peripheral portion of the substrate is lower than that of ultraviolet rays at the central portion of the substrate by about 5%. Therefore, a film forming rate at the peripheral portion of the substrate is lower than that at the central portion of the substrate, and a film having a nonuniform in thickness is obtained.

On the other hand, in this embodiment, since the transparent nozzle plate 303 is formed such that an ultraviolet transmittance is low at the central portion of the target substrate 305, the illuminance of ultraviolet rays on the target substrate 305 is constant as indicated by a curve 352 in FIG. 19. Therefore, a film forming rate is constant on the target substrate 305, a film having a uniform film thickness can be obtained.

In this manner, according to this embodiment, even when the intensity distribution of the ultraviolet source 301 is not uniform, the transparent nozzle plate 303 having an ultraviolet transmittance distribution corresponding to the intensity distribution makes it possible to uniform the illuminance of ultraviolet rays on the target substrate 305, thereby obtaining a silicon thin film having a uniform film thickness. In this embodiment, the ultraviolet source 301 constituted by the single low-pressure mercury lamp has been described. However, the present invention can be applied to a case wherein an ultraviolet source constituted by a plurality of low-pressure mercury lamps is used.

FIG. 20 is a schematic view showing the arrangement of a laminar flow type photo-assisted CVD apparatus according to the ninth embodiment of the present invention.

A target substrate 406 is placed inside the reaction chamber 405. The target substrate 406 is heated by a heater 407. A lamp house 414 is arranged above the reaction chamber 405. An ultraviolet source 401 constituted by a low-pressure mercury lamp or the like is arranged in the lamp house 414. An $N_2$ gas is fed from one end of the lamp house 414 and exhausted from the other end.

Figure 21A:
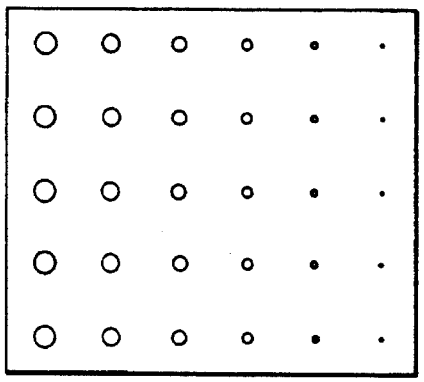
FIGS. 21A and 21B are plan views showing the arrangement of a transparent nozzle of the photo-assisted CVD apparatus shown in FIG. 20.
Figure 21B:
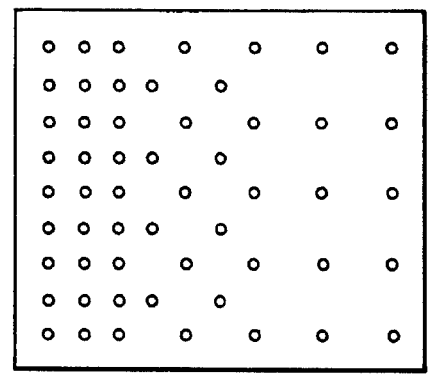

A light-receiving window 402, a transparent nozzle plate 404, and a gas flow control plate 411 are sequentially arranged below the ultraviolet source 401. The light-receiving window 402, the transparent nozzle plate 404, and the gas flow control plate 411 consist of a material, e.g., synthetic quartz, transparent to ultraviolet rays. The transparent nozzle plate 404 is formed such that the spray amount of a purge gas 410 is increased in the flow direction of the source gas in the reaction chamber 405. More specifically, as shown in FIG. 21A, the opening areas of the nozzles may be increased in the flow direction of the source gas, in other words, toward an exhaust port 415, or as shown in FIG. 21B, the density of the nozzles may be increased in the flow direction of the source gas. Ultraviolet rays emitted from the ultraviolet source 401 are radiated on the target substrate 406 through the light-receiving window 402, the transparent nozzle plate 404, and the gas flow control plate 411.

A mercury reservoir 412 for storing mercury whose temperature is kept constant, a source gas supply portion (not shown) for storing a source gas such as $SiH_4$, a purge gas supply portion (not shown) for storing an inert gas such as Ar serving as a purge gas, and a gas exhaust portion 408 constituted by a mechanical booster pump or the like are arranged outside the reaction chamber 304.

A source gas supplied from the source gas supply portion is fed into the reaction chamber 405 through the mercury reservoir 412 and a source gas feed nozzle 409a.

A purge gas feed nozzle 409b is arranged at the lower end portion of the light-receiving window 402. The purge gas 410 is supplied by the purge gas feed nozzle 409b and the purge gas supply portion into the space between the light-receiving window 402 and the transparent nozzle plate 404, i.e., a purge chamber 403, and the purge gas 410 is blown on the target substrate 406 through the transparent nozzle plate 404 and the gas flow control plate 411. As a result, a gas mixture of the source gas and the mercury vapor flows parallelly to the target substrate 406 to form a laminar flow of the gas mixture near the surface of the target substrate 406 and to form a laminar flow of the purge gas 410 at portions except for the portion near the surface of the target substrate 406.

A method of forming a hydrogenated silicon thin film using the photo-assisted CVD apparatus arranged as described above will be described below.

A gas in the reaction chamber 405 is exhausted by the gas exhaust portion 408 to set the pressure in the reaction chamber 405 to 0.2 Torr or less, and the target substrate 406 is heated by the heater 407 to a temperature of about 200° to 300° C.

The $SiH_4$ gas serving as the source gas diluted with an Ar carrier gas is fed into the reaction chamber 405 through the mercury reservoir 412 and the source gas feed nozzle 409a under the condition of a total flow rate of 0.5 SLM or more. An Ar gas is fed as the purge gas 410 from the purge gas feed nozzle 409b at a flow rate of 4.0 SLM or more to be supplied into the purge chamber 403. The purge gas 410 is adjusted by the transparent nozzle plate 404 such that a flow rate of the purge gas 410 on the downstream side is high, and the purge gas 410 is blown on the surface of the target substrate 406.

The ultraviolet source 401 is set such that an ultraviolet illuminance on the target substrate 406 is set to be 15 mW/cm$^2$ as close as possible at a wavelength of 254 nm, and the ultraviolet rays are radiated on the surface of the target substrate 406. As a result, Hg atoms are excited by the ultraviolet rays from the ultraviolet source 401, and the $SiH_4$ gas receives an energy upon colliding with the excited Hg atoms and is decomposed to produce $SiH_3$ radicals serving as a film forming species. The $SiH_3$ radicals produced as described above are deposited on the target substrate 406 to form a hydrogenated amorphous silicon thin film at a film forming rate of 15 nm/min.

when the amorphous silicon thin film formed as described above was examined, the thickness of the amorphous silicon thin film was uniform on the target substrate 406 unlike that of an amorphous silicon thin film formed by using the conventional photo-assisted CVD apparatus.

A reason for this result will be described as follows. In the conventional photo-assisted CVD apparatus, a gas blow amount is constant. That is, an amount of the purge gas 410 blown on the surface of the target substrate 406 is constant within the surface of the substrate. Since the purge gas 410 on the upstream side flows in the downstream side, the total gas amount on the substrate on the downstream side is larger than that on the substrate on the upstream side. For this reason, the $SiH_3$ radicals serving as a film forming species and produced on the downstream side cannot be pressed on the target substrate 406, or the $SiH_3$ radicals flow at a portion apart from the target substrate 406. Therefore, the concentration of the $SiH_3$ radicals of the surface of the target substrate 406 on the upstream side is different from that of the surface of the target substrate 406 on the downstream side, and a film having nonuniform in film quality is obtained.

On the other hand, in this embodiment, since the gas blow amount of the transparent nozzle plate 404 is increased toward the downstream side, the concentration of the $SiH_3$ radicals is kept constant on the surface of the target substrate 406 independently of positions. Therefore, a hydrogenated amorphous silicon film having uniform film quality can be formed.

Figure 22:
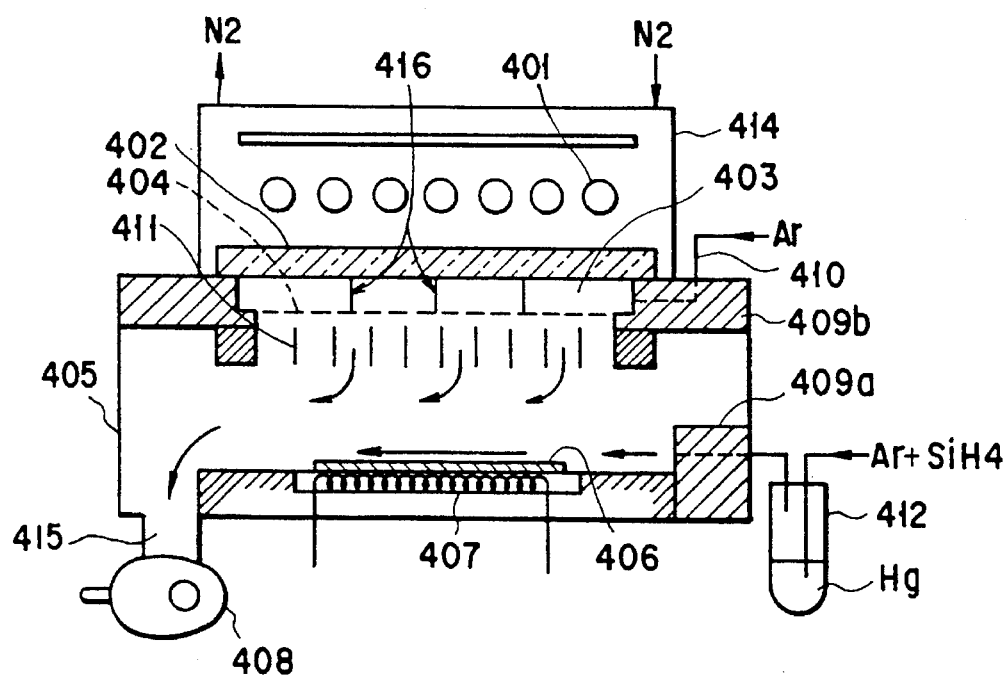
FIG. 22 is a schematic view showing the arrangement of a laminar flow type photo-assisted CVD apparatus according to the tenth embodiment of the present invention.

FIG. 22 is a schematic view showing a laminar flow type photo-assisted CVD apparatus according to the tenth embodiment of the present invention.

The laminar flow type photo-assisted CVD apparatus of this embodiment is different from and the laminar flow type photo-assisted CVD apparatus of the previous embodiment in that a purge chamber 403 is divided by partition plates 416 and that a flow rate adjusting means is arranged for adjusting the flow rate of a purge gas fed in each of the divided purge chambers 403. As the flow rate adjusting means, a valve is arranged between each of the purge chambers 403 and a purge gas feed nozzle 409b, and the flow rate may be adjusted by opening/closing the valve. As another method, the purge chamber 403 may be divided by the partition plates 416 such that the volumes of the divided purge chambers are increased toward the downstream. As a material of the partition plates 416, quartz transparent to ultraviolet rays is used.

According to the laminar flow type photo-assisted CVD apparatus arranged as described above, a large amount of a purge gas 410 can be fed into the purge chambers 403 near the downstream by the flow rate adjusting means. Therefore, the gas blow amount of a transparent nozzle plate 404 can be increased toward the downstream, and a hydrogenated uniform silicon film having film quality can be formed.

Note that a purge chamber can be divided into a plurality of purge chambers having the same volume, a material, e.g., Ar, having a large mass can be used as a purge gas in the purge chambers near the downstream, and a material, e.g., He, having a small mass can be used as a purge gas in the purge chambers near the upstream. In this manner, even when a total gas amount on the target substrate on the downstream side is larger than that on the target substrate on the upstream side, $SiH_3$ radicals serving as a film forming species and produced on the downstream side are pressed on the target substrate, thereby forming a hydrogenated amorphous silicon film having uniform film quality.

In the ninth and tenth embodiments, the formation of the amorphous silicon film has been described. The present invention can also be applied to the formation of an amorphous silicon carbide film, an amorphous silicon nitride film, or the like.

Figure 23:
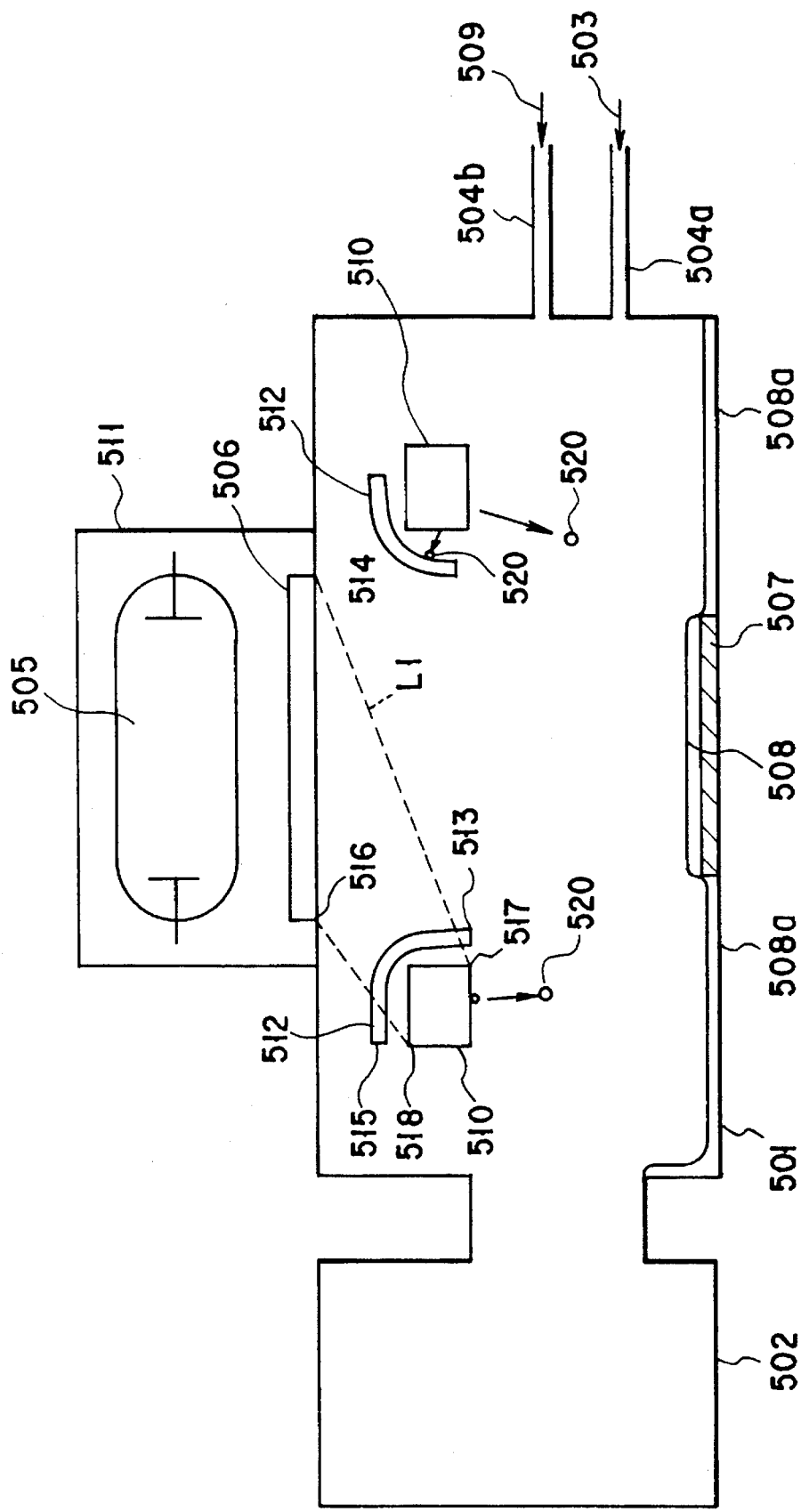
FIG. 23 is a schematic view showing the arrangement of a photo-assisted CVD apparatus according to the eleventh embodiment of the present invention.

FIG. 23 is a schematic view showing the arrangement of a photo-assisted CVD apparatus according to the eleventh embodiment of the present invention.

A target substrate 507 is placed inside a reaction chamber 501. The target substrate 507 is heated by a heater (not shown). Cleaning discharge electrodes 510 (discharge electrodes for removing a deposit) connected to a high-frequency power supply (not shown) are arranged above the target substrate 507.

A lamp house 511 is arranged in the upper portion of the reaction chamber 501, and an ultraviolet source 505 such as a low-pressure mercury lamp is arranged inside the lamp house 511.

Ultraviolet rays emitted from the ultraviolet source 505 are radiated on the target substrate 507 through a light-receiving window 506 consisting of quartz or the like. Shielding plates 512 are arranged between the light-receiving window 506 and the cleaning discharge electrodes 510. An end portion 513 of each of the shielding plates 512 preferably extends below a line (a dotted line $L_1$ in FIG. 23) extending from a lower end portion 517 of the corresponding cleaning discharge electrode 510 to an end portion 514 of the light-receiving window 506. Similarly, an end portion 515 of the shielding plate 512 preferably extends above a line (a dotted line $L_2$ in FIG. 23) extending from an upper end portion 518 of the cleaning discharge electrode 510 to an end portion 516 of the light-receiving window 506.

A source gas supply portion (not shown), an etching gas supply portion (not shown), and a gas exhaust portion 502 are arranged outside the reaction chamber 501. The gas exhaust portion 502 is constituted by a vacuum exhaust pump or the like.

A method of forming an amorphous silicon thin film using the photo-assisted CVD apparatus arranged as described above will be described below.

A gas in the reaction chamber 501 is exhausted by the gas exhaust portion 502 to decrease the pressure in the reaction chamber 501.

A source gas 503 supplied from the source gas supply portion is fed into the reaction chamber 501 through a source gas feed nozzle 504a. As the source gas 503, an $SiH_4$ gas having a flow rate of, e.g., 100 SCCM is used. At the same time, an Hg vapor at a temperature of 85° C. is fed into the reaction chamber 501. The ultraviolet source 505 is turned on to radiate ultraviolet rays on the surface of the target substrate 507 heated to 230° C. by the heater. As a result, the Hg atoms are excited with the ultraviolet rays from the low-pressure mercury lamp, and the $SiH_4$ gas receives an energy upon colliding with the excited Hg atoms and is decomposed to produce $SiH_3$ radicals serving as a film forming species. The $SiH_3$ radicals produced as described above are deposited on the target substrate 507 to form an amorphous silicon thin film 508.

A method of removing the amorphous silicon thin film 508a deposited inside the reaction chamber 501 will be described below.

First, the target substrate 507 is unloaded from the reaction chamber 501, and a gas in the reaction chamber 501 is exhausted by the gas exhaust portion 502 to decrease the pressure in the reaction chamber 501 to 0.2 Torr. An etching gas 509, e.g., an $SF_6$ gas having a flow rate of 100 SCCM, is fed into the reaction chamber 501 through an etching gas feed nozzle 504b. Thereafter, an RF voltage is applied to the cleaning discharge electrodes 510 by the high-frequency power supply to produce an RF discharge (200 W). In this manner, the $SF_6$ gas is decomposed to produce F radicals. The amorphous silicon thin film 508a deposited inside the reaction chamber 501 is etched to be removed by these F radicals.

At this time, the surface of each of the cleaning discharge electrodes 510 is sputtered to produce sputter atoms 520. However, the sputter atoms 520 are shielded by the shielding plates 512 arranged between the light-receiving window 506 and the cleaning discharge electrodes 510 without reaching the light-receiving window 506.

A decrease in transmittance of the light-receiving window 506 caused by depositing sputter atoms on the light-receiving window 506 can be prevented.

In this embodiment, as the material of the shielding plates 512, quartz, stainless steel, or the same material as that of the inner wall of the reaction chamber 501 may be used in place of aluminum. In this embodiment, although the fixed shielding plates 512 are exemplified above, movable shielding plates 512 may be used. In addition, the present invention can be applied to various photo-assisted CVD apparatuses including a laminar flow type photo-assisted CVD apparatus.

Figure 24:
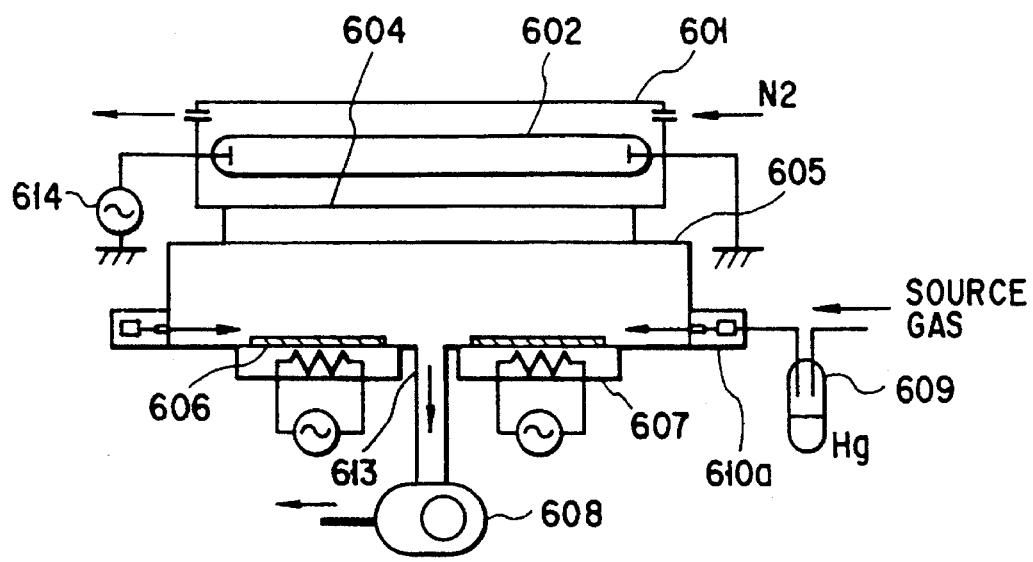
FIG. 24 is a schematic view showing the arrangement of a mercury-sensitized photo-assisted CVD apparatus according to the twelfth embodiment of the present invention.

FIG. 24 is a schematic view showing the arrangement of a mercury-sensitized photo-assisted CVD apparatus according to the twelfth embodiment of the present invention.

An exhaust port 613 is formed at the lower portion of a reaction chamber 605. A heater 607 is arranged around the exhaust port 613, and four target substrates 606 are placed on the heater 607. A lamp house 601 purged with an $N_2$ gas is arranged on the upper portion of the reaction chamber 605. An ultraviolet source 602 constituted by a low-pressure mercury lamp is arranged in the lamp house 601, and the ultraviolet source 602 is connected to a power supply 614.

Ultraviolet rays emitted from the ultraviolet source 602 are radiated on the target substrates 606 through a light-receiving window 604 consisting of quartz or the like.

A mercury reservoir 609 for storing mercury whose temperature is kept constant, a source gas supply portion (not shown) for storing a source gas such as $SiH_4$, and a gas exhaust portion 608 constituted by a vacuum exhaust pump are arranged outside the reaction chamber 608.

Figure 25:
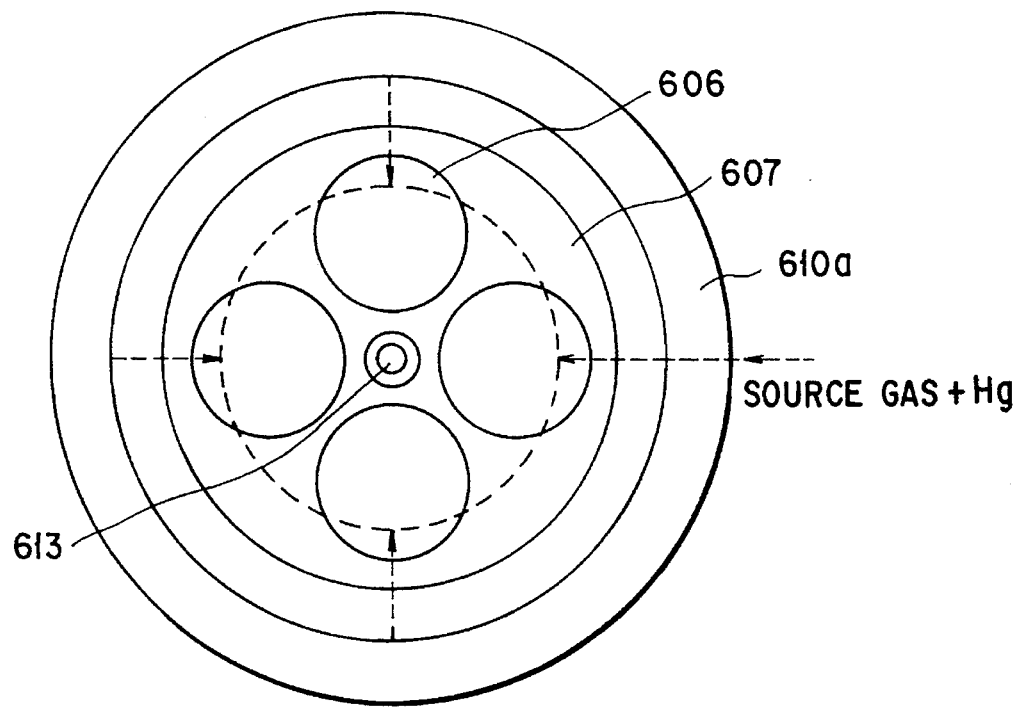
FIG. 25 is a plan view showing an arrangement of substrates in the CVD apparatus shown in FIG. 24.

A source gas supplied from the source gas supply portion is fed into the reaction chamber 605 through the mercury reservoir 609 and a source gas feed nozzle 610a. The source gas feed nozzle 610a is formed to have a ring-like shape, as shown in FIG. 25. The source gas is isotropically fed to the target substrates 606 through a circular slit circumferentially formed inside the source gas feed nozzle 610a. The source gas is fed in the directions from the target substrates 606 to the exhaust port 613 as indicated by dotted arrows in FIG. 25. The slit need not be continuously formed, and any slit which can substantially isotropically feed the source gas to the target substrates 606 may be used.

A method of forming an amorphous silicon thin film using the photo-assisted CVD apparatus arranged as described above will be described below.

A gas in the reaction chamber 605 is exhausted by the gas exhaust portion 608 to decrease the pressure in the reaction chamber 605.

An $SiH_4$ gas serving as a source gas is fed from the source gas supply portion into the reaction chamber 605 through the mercury reservoir 609, and the ultraviolet source 602 is turned on to radiate ultraviolet rays on the surfaces of the target substrates 606. At this time, the target substrates 606 are heated by the heater 607.

As a result, Hg atoms are excited with the ultraviolet rays from the ultraviolet source 602, and the $SiH_4$ gas receives an energy upon colliding with the excited Hg atoms and is decomposed to produce $SiH_3$ radicals serving as a film forming species. The $SiH_3$ radicals produced by the above mercury sensitization reaction are deposited on the surfaces of the target substrates 606 to form hydrogenated amorphous silicon films. At this time, since the source gas flowing over the target substrates 606 is exhausted out of the reaction chamber 605 through the exhaust port 613 formed at the central portion of the reaction chamber 605, the transport distance of the source gas is almost equal to the diameter of one of the target substrates 606.

According to this embodiment, the $SiH_3$ radicals serving as a film forming species and produced at the peripheral portion of the reaction chamber 605 pass over the target substrates 606 toward the exhaust port 613 at the central portion of the reaction chamber 605. For this reason, the transport distance of the source gas is shortened compared with that of a conventional photo-assisted CVD apparatus, i.e., a photo-assisted CVD apparatus in which a source gas feed nozzle and an exhaust port are respectively formed at both the end portions of a reaction chamber. Therefore, the photo-assisted CVD apparatus of this embodiment is not easily influenced by the degradation of film characteristics caused by an increase in the number of $SiH_2$ radicals serving as a secondary film forming species on the downstream side of the source gas. The degradation is a problem in a conventional CVD apparatus.

In this embodiment, since the flow of the source gas has an inverted V-shape b toward the exhaust port 613 at the central portion of the reaction chamber 605, the distribution density of the source gas is decreased in proportion to the square of the distance from the exhaust port 613. Therefore, the supply rate of the source gas at the peripheral portion in the reaction chamber 605 is higher than that at the central portion in the reaction chamber 605, and a decrease in film forming rate on the downstream side of the source gas, which poses a problem in the conventional CVD apparatus, can be prevented.

FIGS. 26A to 26C are graphs showing the above effect. FIG. 26A shows a relationship between a substrate position and $SiH_4$, a relationship between the substrate position and the gas concentration of $SiH_3$ radicals ($SiH_3^*$), a relationship between the substrate position and the gas concentration of $SiH_2$ radicals ($SiH_2^*$). FIG. 26B shows a relationship between a substrate position and a film forming temperature, and FIG. 26C shows an $SiH_2$ bonding ratio ($C_a/C_b$: a=$SiH_2$, b=H). Note that values are plotted along the ordinates of FIGS. 26A to 26C in arbitrary units.

As is apparent from FIGS. 26A to 26C, the gas concentrations, the film forming rate, and the $SiH_2$ bonding ratio are constant independently of the substrate positions in the CVD apparatus according to the thirteenth embodiment of the present invention. In other words, these values are constant within the surface of the substrate. In contrast to this, in the conventional CVD apparatus, the values on the upstream side of the source gas are different from those on the downstream side.

This embodiment is free from the following drawback. That is, the supply of a source gas is rate-determined on the downstream side by consuming the source gas on the upstream side, and the film forming rate on the downstream side is decreased. For this reason, even when a plurality of target substrates are used, i.e., even when thin films are to be formed on a target substrate group, thin films each having a uniform film thickness and uniform film quality can be formed.

Figure 27:
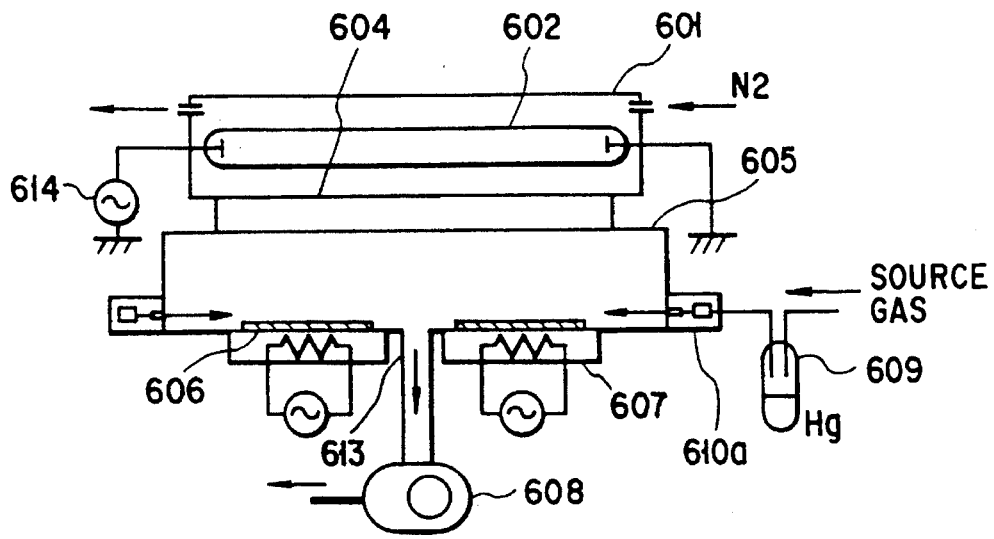
FIG. 27 is a schematic view showing the arrangement of a mercury-sensitized photo-assisted CVD apparatus according to the thirteenth embodiment of the present invention.

FIG. 27 is a schematic view showing the arrangement of a mercury-sensitized photo-assisted CVD apparatus according to the thirteenth embodiment of the present invention.

Figure 28:
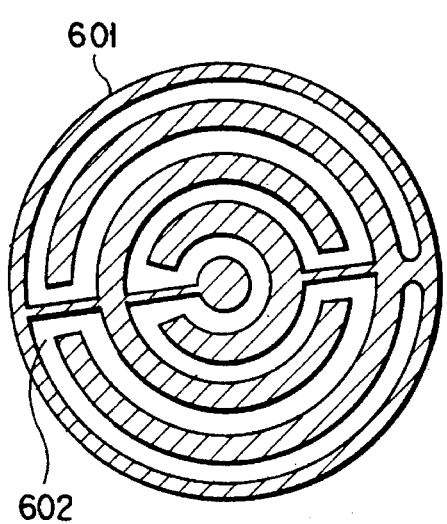
FIG. 28 is a view showing the shape of the ultraviolet source of the CVD apparatus shown in FIG. 27.

A characteristic feature of the mercury sensitization photo-assisted CVD apparatus of this embodiment is, as shown in FIG. 28, that the longitudinal (extending) direction of an ultraviolet source 602 coincides with the direction of a circumference having an exhaust port 613 as its center. That is, a plurality of torus-like ultraviolet source elements are substantially concentrically arranged above the target substrates 606.

Figure 29A:
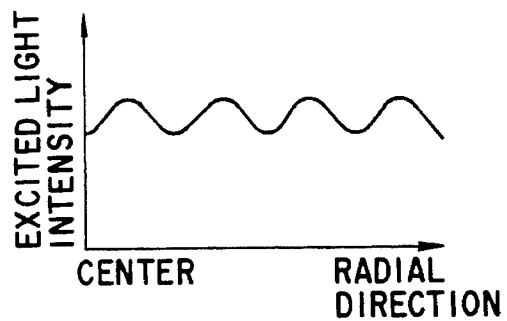
FIGS. 29A and 29B are graphs showing an excited light intensity distribution in the reaction chamber of the CVD apparatus shown in FIG. 27.
Figure 29B:
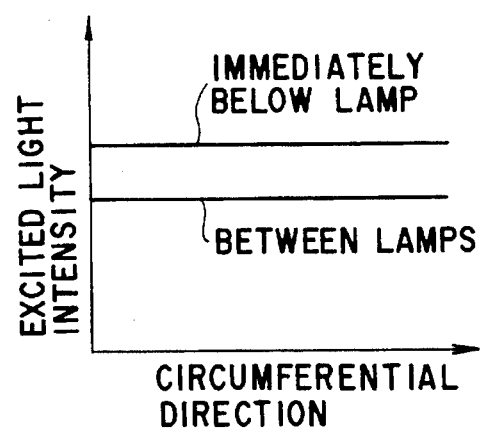

When the above ultraviolet source 602 is used, an excited light intensity distribution in a reaction chamber 605 is uniform, as shown in FIG. 29B, in the direction of the circumference having the exhaust port 613 as its center, but the excited light intensity distribution periodically varies, as shown in FIG. 29A, in the radial direction of a circle having the exhaust port 613 as its center, i.e., in the flow direction of the source gas.

However, the variation in excited light intensity, as described above, is present in the flow direction of the source gas. In fact, the excited light intensity is averaged by the transport of a film forming species produced by decomposing the source gas.

Even if the plurality of target substrates 606 are used, as in the previous embodiment, thin films can be uniformly formed on the target substrates 606 because an effective excited light intensity is uniformed on the target substrates 606.

Figure 30:
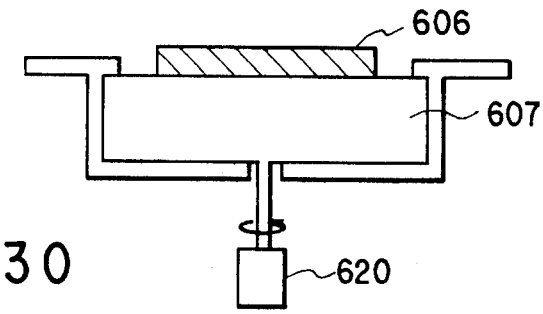
FIG. 30 is a view showing a mechanism for rotating a substrate.

In order to more uniform the excited light intensity, each of the target substrates 606 may be subjected to revolution on its own axis, i.e., each target substrate 606 is revolved on its own axis. For example, as shown in FIG. 30, a heater 607 may be rotated by the motor 620.

Figure 31:
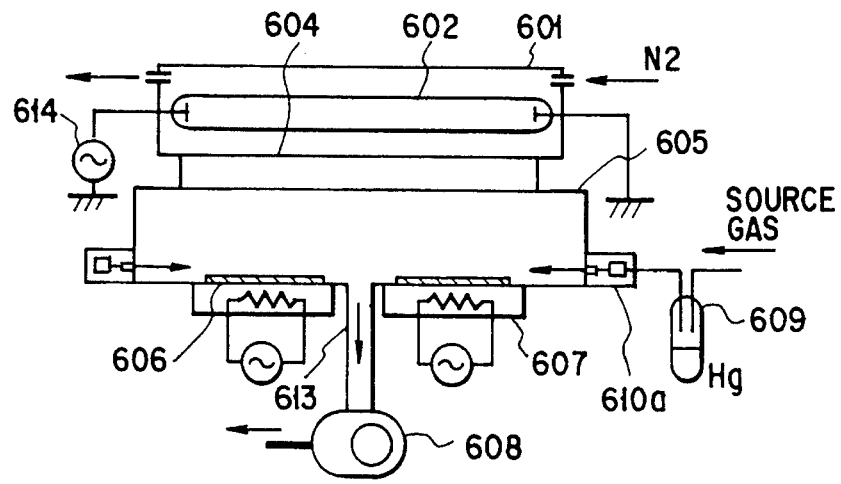
FIG. 31 is a schematic view showing the arrangement of a mercury-sensitized photo-assisted CVD apparatus according to the fourteenth embodiment of the present invention.

FIG. 31 is a schematic view showing a mercury-sensitized photo-assisted CVD apparatus according to the fourteenth embodiment of the present invention.

Figure 32:
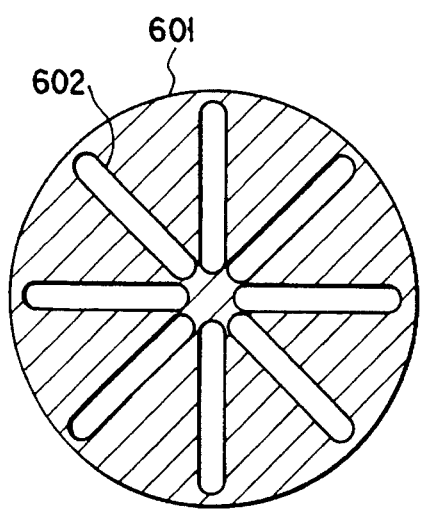
FIG. 32 is a view showing the shape of the ultraviolet source of the CVD apparatus shown in FIG. 31.
Figure 33A:
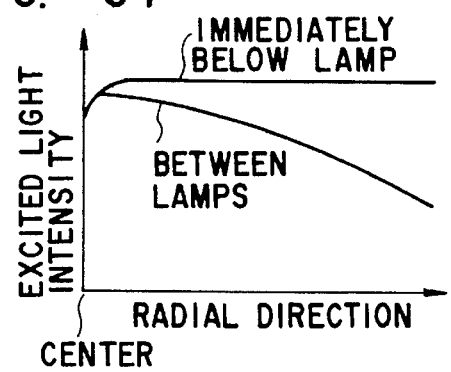
FIGS. 33A and 33B are graphs showing an excited light intensity distribution in the reaction chamber of the CVD apparatus shown in FIG. 31.
Figure 33B:
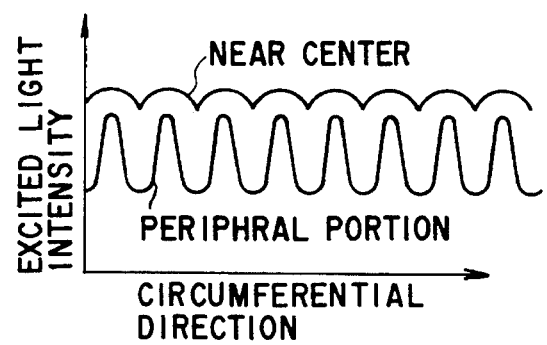

Characteristic features of the mercury-sensitized photo-assisted CVD apparatus of this embodiment are, as shown in FIG. 32, that the longitudinal (extending) direction of ultraviolet sources 602 coincides with the radial direction of a circle having an exhaust port 613 as its center, and that all target substrates 606 are subjected to circumferential rotation around the center near the exhaust port 613, i.e., the target substrates 606 are rotated around this center.

when the above ultraviolet sources 602 are used, as shown in FIG. 33A, an excited light intensity distribution in the reaction chamber 605 is uniformed immediately below the ultraviolet sources 602 in the radial direction of a circle having the exhaust port 613 as its center, but a distribution in which an excited light intensity is exponentially decreased from the center to the periphery of the reaction chamber is exhibited between the ultraviolet sources 602. On the other hand, as shown in FIG. 33B, a distribution in which an excited light intensity periodically varies is exhibited in the direction of the circumference having the exhaust port 613 as its center.

However, since the target substrates 606 are subjected to rotation in the circumferential direction around the center located a near the exhaust port 613, a distribution in which an excited light intensity in the radial direction is exponentially decreased from the center to the periphery of the reaction chamber independently of positions, i.e., a position immediately below the ultraviolet sources 602 and a position between the ultraviolet sources 602, is exhibited. On the other hand, the excited light intensity distribution in the circumferential direction is uniformed. For this reason, the same effect as described in the first to fifth embodiments can be obtained.

That is, a reaction as a decomposition reaction of the source gas on the downstream side to produce a film forming species is enhanced due to the excited light intensity distribution in which an excited light intensity on the target substrates 606 is exponentially increased from the upstream side to the downstream side in the flow direction of the source gas. As a result, the number of $SiH_3$ radicals serving as a primary film forming species is relatively increased to cancel an increase in the number of $SiH_2$ radicals serving as a secondary film forming species on the downstream side, and a decrease in film forming rate on the downstream side caused by the consumption of the source gas on the upstream side is suppressed. Therefore, thin films each having uniform film quality can be formed on the target substrate group.

As in the previous embodiment, when the target substrate 606 is revolved on an axis within it, i.e., when the target substrate 606 is revolved on its own axis, a thin film having uniform film quality can be formed.

FIG. 34 is a schematic view showing a mercury-sensitized photo-assisted CVD apparatus according to the fifteenth embodiment of the present invention.

The mercury sensitization photo-assisted CVD apparatus of this embodiment is different from the photo-assisted CVD apparatus of the previous embodiment in that, as shown in FIG. 35, heat ray sources 603 for heating substrates are arranged in spaces between ultraviolet sources 602 in a lamp house 601. As each of the heat ray sources 603, for example, an infrared lamp is used.

According to the mercury-sensitized photo-assisted CVD apparatus arranged as described above, the heater 607 in the previous embodiment is not required, a revolving mechanism for revolving the above target substrates 606 can be simplified.

The light intensity distributions of the plurality of heat ray sources 603 are averaged because the target substrates 606 are revolved by the above revolving mechanism. For this reason, differences in temperatures of the target substrates, which differences are inevitable in a conventional CVD apparatus, caused by different temperature distributions between heaters for heating the substrates can be completely averaged. Therefore, each thin film having uniform film quality can be formed on each target substrate surface, and uniform film quality can also be obtained for thin films respectively formed on different target substrate surfaces. Note that, as in the previous embodiment, when the target substrate 606 is revolved on an axis within it, i.e., when the target substrate 606 is revolved on its own axis, a thin film having uniform film quality can be formed.

FIG. 36 is a sectional view showing the arrangement of a mercury-sensitized photo-assisted CVD apparatus according to the sixteenth embodiment of the present invention. The mercury sensitization photo-assisted CVD apparatus according to this embodiment is different from the photo-assisted CVD apparatus of the previous embodiment in that target substrates 606 are supported by a target substrate support portion 617 consisting of an insulator.

According to the mercury-sensitized photo-assisted CVD apparatus arranged as described above, the substrates can be effectively heated by a heat ray source 603 shown in FIG. 37, a variation in temperature in each substrate and variations in temperatures of the substrates can be suppressed. Therefore, thin films can be more uniformly formed. In this embodiment, as in the previous embodiment, when each of the target substrates 606 is revolved on an axis within it, i.e., is revolved on it own axis, thin films can be more uniformly formed.

FIG. 38 is a schematic view showing the arrangement of a mercury-sensitized photo-assisted CVD apparatus according to the seventeenth embodiment of the present invention, and FIG. 39 is a plan view showing the layout of target substrates 606. The mercury-sensitized photo-assisted CVD apparatus of this embodiment is different from the photo-assisted CVD apparatus of the thirteenth embodiment in that an exhaust port 613 is formed at the upper central portion of a reaction chamber 605. According to the mercury-sensitized photo-assisted CVD apparatus arranged as described above, since the bottom portion of the reaction chamber 605 is flattened, the above revolving mechanism can be simplified.

Figure 40:
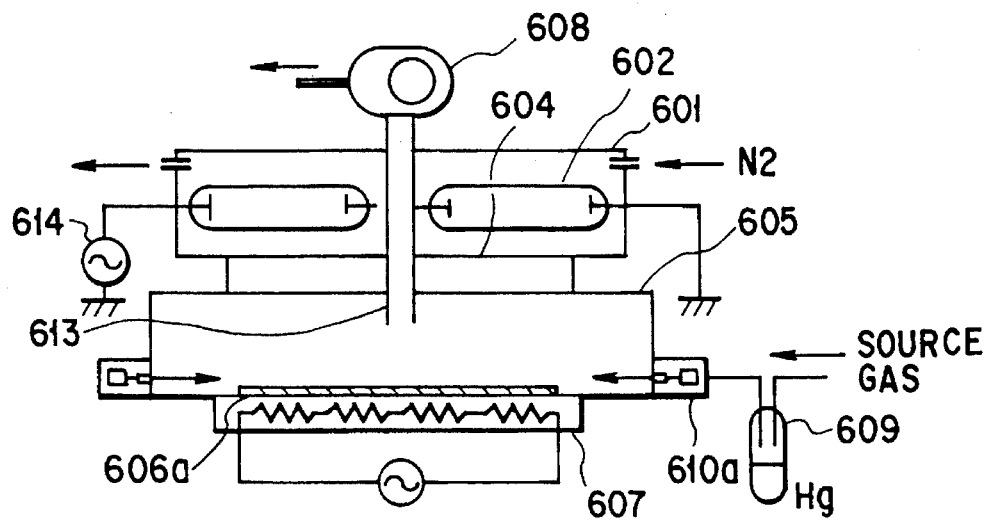
FIG. 40 is a schematic view showing the arrangement of a photo-assisted CVD apparatus in which a rectangular target substrate having a large area is stored.
Figure 41:
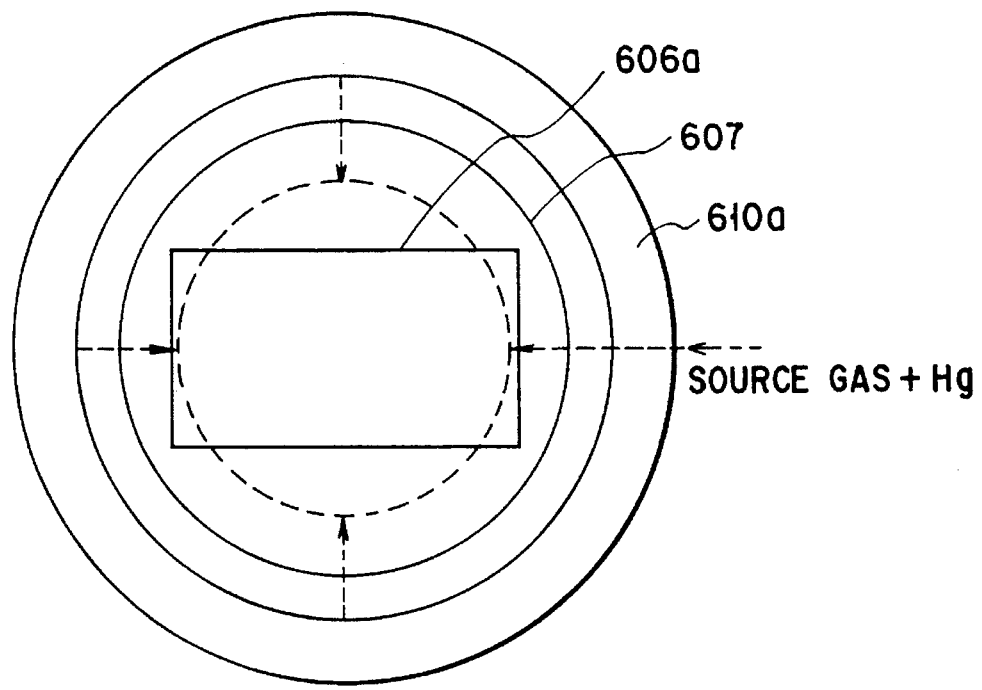
FIG. 41 is a view showing an arrangement of a rectangular target substrate having a large area.

In place of placing the plurality of target substrates 606 on a heater 607, a rectangular target substrate 606a, such as a large-size flat display substrate, having a large area can be placed on the heater 607, as shown in FIGS. 40 and 41. In this case, since a transport distance of a source gas is about ½ the length of the diagonal of the target substrate 606a, a thin film having uniform film quality and a uniform film thickness can be formed.

When a low-pressure mercury lamp is used as an ultraviolet source 602, the exhaust port 613 can be formed by an excited light transmitting material, e.g., synthetic quartz. In this manner, a decrease in excited light intensity on the substrate 606 or 606a at a position where the substrate opposes the exhaust port 613 can be suppressed, and a more uniform thin film can be formed.

FIG. 42 is a schematic view showing the arrangement of a mercury-sensitized photo-assisted CVD apparatus according to the eighteenth embodiment of the present invention.

The mercury-sensitized photo-assisted CVD apparatus of this embodiment has an arrangement in which a laminar flow method is used in the photo-assisted CVD apparatus of the thirteenth embodiment of the present invention.

The photo-assisted CVD apparatus shown in FIG. 42 has an arrangement obtained by adding, to the mercury-sensitized CVD apparatus shown in FIG. 24, a purge chamber 615 arranged between a reaction chamber 605 and a light-receiving window 604, a purge gas feed nozzle 610b for feeding a purge gas consisting of a non-film-forming gas such as an Ar gas into the purge chamber 615, a purge gas feed nozzle plate 611 for separating the purge chamber 615 from the reaction chamber 605 and uniforming the flow rate of the purge gas on a target substrate 606, and a gas flow control plate 612 for controlling the flow of the purge and source gases in the reaction chamber 605. Note that the purge gas feed nozzle 610b has the same arrangement as that of a source gas feed nozzle 610a.

In the photo-assisted CVD apparatus arranged as described above, the same effect as described above can be obtained, as a matter of course. When the laminar flow of the source gas, which is one of characteristic features of the laminar flow type CVD apparatus, is formed by purging with the non-film-forming gas, a thick film on the order of μm can be formed by continuous film formation for a long time, or thin films can be continuously formed. In addition, simultaneous formation of thin films on a plurality of substrates, which is impossible in the conventional laminar flow type CVD apparatus due to the thin-film-forming characteristic distribution in the reaction chamber thereof, can be performed, and a thin film can be uniformly formed on a substrate having a large area.

FIG. 43 is a schematic view showing the arrangement of a mercury-sensitized photo-assisted CVD apparatus according to the nineteenth embodiment of the present invention. The mercury-sensitized photo-assisted CVD apparatus of this embodiment has an arrangement obtained by using a laminar flow method in the photo-assisted CVD apparatus in FIG. 38.

In the mercury-sensitized photo-assisted CVD apparatus arranged as described above, the same effect as that in the nineteenth embodiment can be obtained, and the overall arrangement can easily be simplified because the bottom portion of a reaction chamber 605 is flattened.

As shown in FIG. 44, when a rectangular target substrate 606a having a large area is placed, since the transport distance of a source gas is about ½ the length of the diagonal of the target substrate 606a, a film having a uniform film thickness and uniform film quality can be obtained.

In the thirteenth to nineteenth embodiments, the CVD apparatuses using the mercury sensitization method have been described. The present invention can also be applied to a CVD apparatus using a direct excitation method in which a source gas is directly optically excited.

FIG. 45 is a schematic view showing the arrangement of a photo-assisted CVD apparatus according to the twentieth embodiment of the present invention.

In FIG. 45, reference numeral 701 denotes a reaction chamber. A target substrate holder 703 in which a target substrate 702 constituted by, e.g., a semiconductor substrate is placed, is incorporated in the reaction chamber 701, and a heater 704 for heating the target substrate 702 is arranged at the lower portion of the target substrate holder 703. A gas 707 such as a source gas or an etching gas is fed into the reaction chamber 701 through a gas feed portion 706, and the gas 707 is exhausted by an exhaust pump 708. A storage chamber 722 for a cleaning electrode 723 (a discharge electrode for removing a deposit) is connected to the reaction chamber 701 through a gate valve 721. The storage chamber 722 is also evacuated by the exhaust pump 708. The surface of the cleaning electrode 723 is preferably covered with an insulating material.

Although the cleaning electrode 723 is normally arranged inside the storage chamber 722, when the reaction chamber 701 is to be cleaned, the gate valve 721 is opened, and the cleaning electrode 723 is conveyed into the reaction chamber 701 and arranged on the upper portion of the target substrate holder 703. When deflection occurs at the end of the cleaning electrode 723 when the cleaning electrode 723 is conveyed, an insulating convey guide 725 for supporting both the ends of the cleaning electrode can be arranged in the reaction chamber 701.

A lamp house 712 for storing a light source 711 constituted by, e.g., a low-pressure mercury lamp, is arranged above the reaction chamber 701, and a reaction plate 713 for reflecting light emitted from the light source 711 is arranged on the rear side of the light source 711.

The reaction chamber 701 is separated from the lamp house 712 by a light-receiving window 714 consisting of, e.g., synthetic quartz. In FIG. 45, reference numeral 715 denotes a pipe for feeding or exhausting an $N_2$ gas serving as a purge gas into or from the lamp house 712 to prevent the ultraviolet attenuation caused by the light absorption of atmospheric components.

Figure 46A:
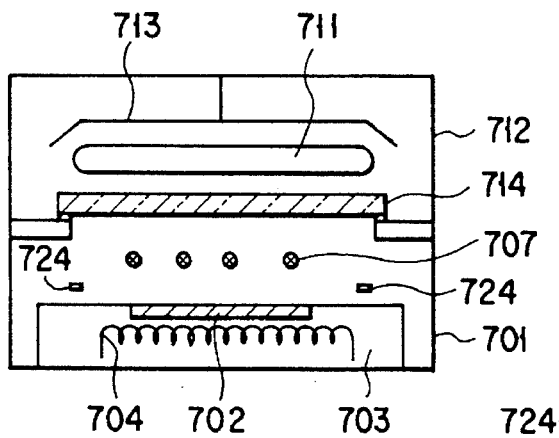
FIGS. 46A and 46B, are sectional views showing the photo-assisted CVD apparatus shown in FIG. 45 in the vertical direction.
Figure 46B:
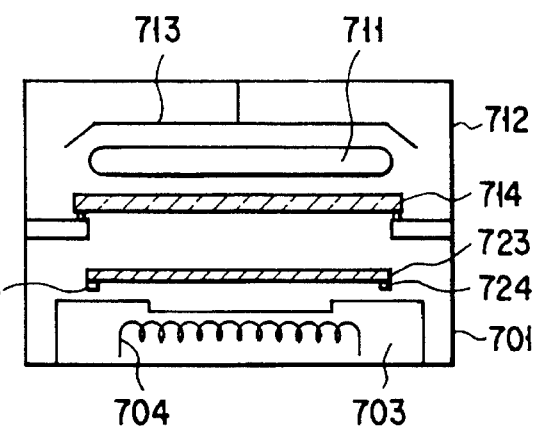

A film forming method and a cleaning method using the CVD apparatus arranged as described above will be described below with reference to FIGS. 46A and 46B. FIG. 46 shows the state of the CVD apparatus during a film forming operation, and FIG. 46B shows the state of the CVD apparatus during a cleaning operation. FIGS. 46A and 46B are sectional views showing the photo-assisted CVD apparatus in FIG. 45 in the vertical direction.

As shown in FIG. 46A, in the film forming operation, the cleaning electrode 723 is set in the state shown in FIG. 45, and light emitted from the light source 711 is radiated on the surface of the target substrate 702 through the light-receiving window 714 as in a conventional photo-assisted CVD apparatus because the cleaning electrode 723 is incorporated in the storage chamber 722. The gas 707 serving as a material for forming a film flows from the rear side to the front side so as to be uniformly supplied on the surface of the target substrate 702, and the gas 707 is decomposed with the radiated light to deposit a thin film on the target substrate 702, When the target substrate 702 is to be cleaned, as shown in FIG. 46B, the cleaning electrode 723 is conveyed from the storage chamber 722 into the reaction chamber 701 and arranged on the upper portion of the target substrate holder 703, and the cleaning electrode 723 and the target substrate holder 703 form a parallel plate RF electrode.

The F-based gas 707 such as an $NF_3$ or $SF_6$ gas is fed as an etching gas into the reaction chamber 701 through the gas feed portion 706. In this state, when the target substrate holder 703 and the inner wall of reaction chamber 701 are grounded, and a high-frequency power is applied to the cleaning electrode 723, a plasma discharge occurs between the target substrate holder 703 and the cleaning electrode 723. In this manner, the etching gas is decomposed to form an etching species, and an unnecessary deposit adhered inside the reaction chamber 701 is etched and removed by the etching species.

According to this embodiment, since the cleaning electrode 723 covers the upper portion of the target substrate holder 703 on which the deposit is maximally adhered, a plasma region is formed in the entire region of the covered portion, and the deposit adhered on the target substrate holder 703 can be uniformly etched. Therefore, an increase in time required for cleaning the inside of the reaction chamber 701, caused by variations in etching, can be prevented, and a throughput can be increased.

On the other hand, in a conventional photo-assisted CVD apparatus, i.e., a photo-assisted CVD apparatus having an arrangement in which rod-like cleaning electrodes are arranged on both the ends of a target substrate, an etching rate at the central portion between the cleaning electrodes is considerably lower than that near the cleaning electrodes. For this reason, the time required for cleaning the inside of the reaction chamber is considerably prolonged, and a throughput is decreased.

Figure 47:
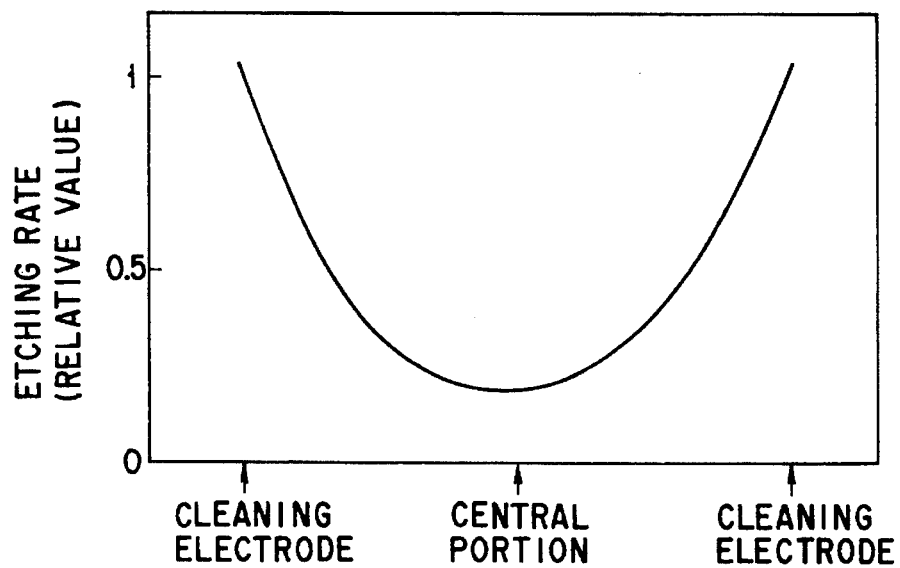
FIG. 47 is a graph showing a relationship between a position on a substrate and an etching rate.

FIG. 47 shows an examination result for explaining the above phenomenon and indicating a relationship between a position on the substrate holder and an etching rate. According to this examination result, in conventional photo-assisted CVD apparatus, when an interval between the cleaning electrodes was 23 cm, the relative etching rate of the central portion between the cleaning electrodes was $\frac{1}{5}$ or less the etching rate near the cleaning electrodes.

According to this embodiment, only when the reaction chamber 701 is to be cleaned, the plate-like cleaning electrode 723 is arranged on the upper portion of the target substrate holder 703, and plasma etching can be performed. For this reason, the time required for etching is considerably shortened, and a throughput can be increased.

FIG. 48 is a schematic view showing the arrangement of a photo-assisted CVD apparatus according to the twenty-first embodiment of the present invention.

The photo-assisted CVD apparatus of this embodiment is different from that of the twentieth embodiment in that a cleaning electrode is constituted by first and second cleaning electrodes.

In FIG. 48, as in the conventional photo-assisted CVD apparatus, a pair of cleaning electrodes 731 are arranged at the upper outer portion of the target substrate holder 703 to be electrically insulated from the target substrate holder 703 and the inner wall of a reaction chamber 701. The electrodes are first cleaning electrodes. A high-frequency power supply (not shown) is connected to the cleaning electrodes 731.

As in the twentieth embodiment, a storage chamber 722 for storing a cleaning electrode is connected to the reaction chamber 701 through a gate valve 721, and a second cleaning electrode 732 is stored in the storage chamber 722. A gas in the storage chamber 722 is exhausted by an exhaust pump 708.

Figure 49:
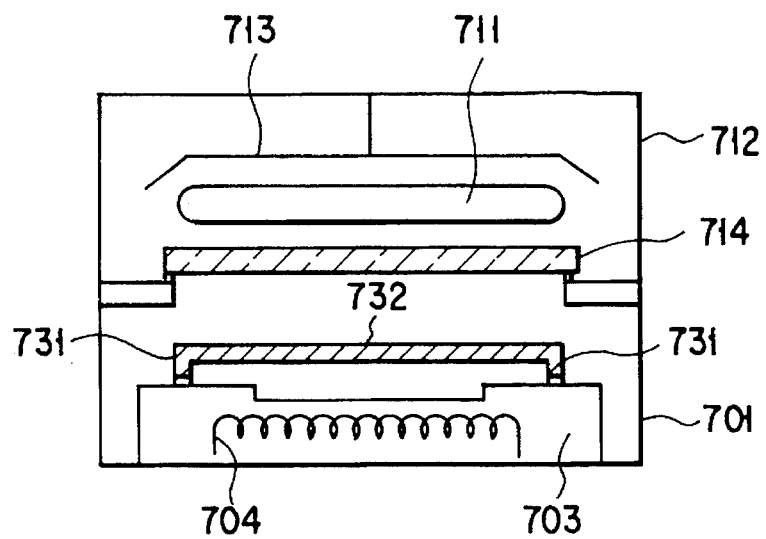
FIG. 49 is a view showing the arrangement of cleaning electrodes during a cleaning operation.

The second cleaning electrode 732 has a parallel plate structure consisting of a material such as stainless steel or aluminum. When the inside of the reaction chamber 701 is to be cleaned, the gate valve 721 is opened, and the cleaning electrode 723 is conveyed into the reaction chamber 701 by a convey mechanism 733 arranged inside the storage chamber 722. As shown in FIG. 49, the cleaning electrode 732 is arranged like a bridge on the pair of left and right cleaning electrodes 731 serving as the first cleaning electrodes. In this manner, the first and second cleaning electrodes 731 and 732 are connected to each other to form an integrated cleaning electrode.

Even in the photo-assisted CVD apparatus arranged as described above, as in the previous embodiment, a parallel plate electrode structure is formed by the target substrate holder 703 and the first and second cleaning electrodes 731 and 732. For this reason, an unnecessary deposit adhered on the target substrate holder 703 whose deposited film has a largest thickness can be uniformly etched and removed. Therefore, the time required for etching can be shortened, and a throughput can be increased.

In the photo-assisted CVD apparatus shown in FIG. 48, the electrode shown in FIG. 15A or 17A can be used as the first cleaning electrodes.

Figure 50A:
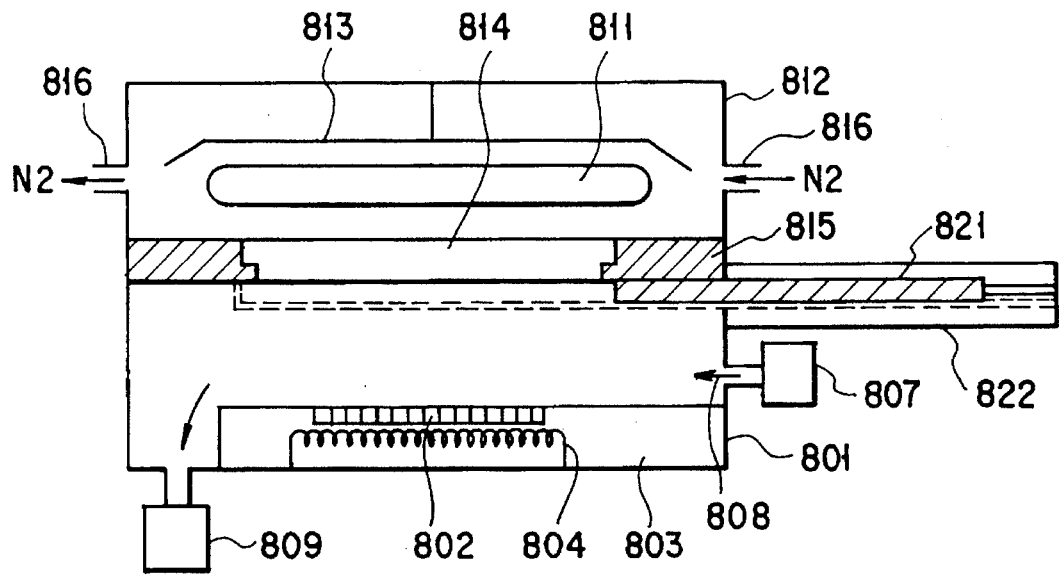
FIGS. 50A and 50B are schematic views showing the arrangement of a photo-assisted CVD apparatus according to the twenty-second embodiment of the present invention.
Figure 50B:
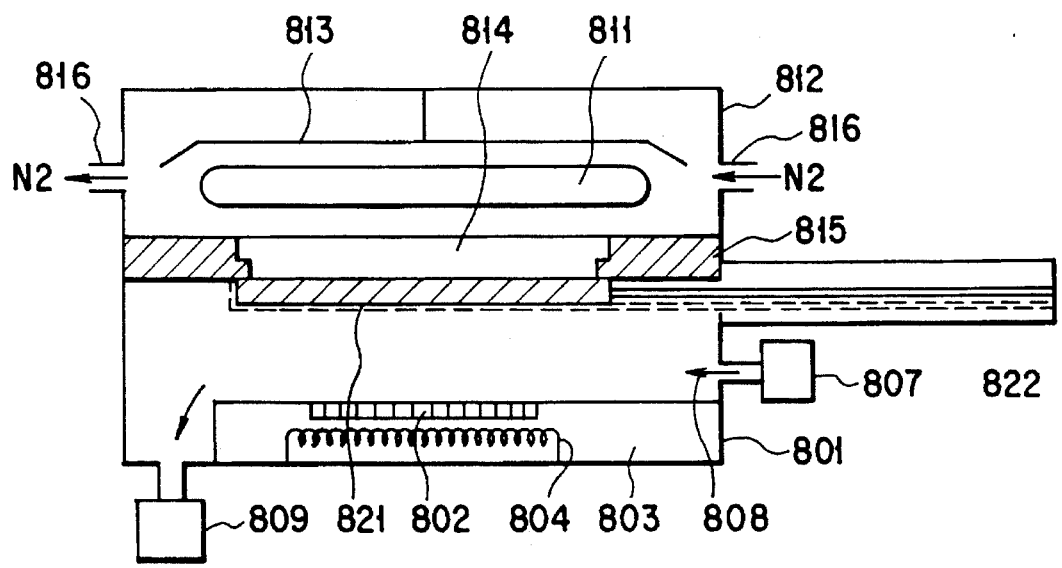

FIGS. 50A and 50B are schematic views showing the arrangement of a photo-assisted CVD apparatus according to the twenty-second embodiment of the present invention. In FIGS. 50A and 50B, reference numeral 801 denotes a reaction chamber. A target substrate holder 803 for supporting a target substrate 802 thereon is incorporated in the reaction chamber 801, and a heater 804 for heating the reaction chamber 801 is arranged at the lower portion of the target substrate holder 803. A gas 808 such as a source gas or an etching gas is fed from a gas supply portion 807 into the reaction chamber 801, and the gas 808 is exhausted by an exhaust pump 809.

A light source storage chamber 812 for storing a light source 811 such as a low-pressure mercury lamp is arranged on the reaction chamber 801, and a reflection plate 813 for reflecting light emitted from the light source 811 arranged on the rear side of the light source 811. The reaction chamber 801 is separated from the light source storage chamber 812 by a light-receiving window 814 consisting of synthetic quartz or the like. Note that reference numeral 816 denotes a pipe for feeding or exhausting an $N_2$ gas serving as a purge gas into or from the light source storage chamber 812.

A cleaning electrode 821 (an electrode for removing a deposit) for plasma-cleaning the inside of the reaction chamber 801 is arranged near the light-receiving window 814 in the reaction chamber 801. As shown in FIG. 50A, during a film forming operation, the cleaning electrode 821 is generally stored in an electrode storage portion 822 offset from a position immediately below the light-receiving window 814. On the other hand, in a cleaning operation, as shown in FIG. 50B, the cleaning electrode 821 is conveyed to the position immediately below the light-receiving window 814 by a convey mechanism (not shown), and the cleaning electrode 821 is arranged to cover the light-receiving window 814 to prevent the surface of the light-receiving window 814 on the reaction-chamber side from being exposed to the etching gas.

A high-frequency power is applied to the cleaning electrode 821, and discharge occurs between the cleaning electrode 821 and the grounded inner wall of the reaction chamber 801. For this reason, the cleaning electrode 821 is electrically insulated from the reaction chamber 801. The surface of the cleaning electrode 821 may be covered with an insulating material such as quartz glass having a low sputtering rate to prevent the cleaning electrode 821 itself from being sputtered.

A film forming method and a cleaning method using the CVD apparatus arranged as described above will be described below.

In a film forming operation, as shown in FIG. 50A, since the cleaning electrode 821 is in the electrode storage portion 822 offset from the position immediately below the light-receiving window 814, light emitted from the light source 811 passes through the light-receiving window 814 and is directly radiated on the surface of the target substrate 802. The source gas 808 is supplied from the gas supply portion 807 onto the surface of the target substrate 802 and decomposed with the radiated light to deposit a thin film on the target substrate 802.

When the inside of the reaction chamber 801 is to be cleaned, as shown in FIG. 50B, the cleaning electrode 821 is conveyed from the electrode storage portion 822 to the position immediately below the light-receiving window 814, and the cleaning electrode 821 is located to cover the light-receiving window 814 so as to prevent the surface of the light-receiving window 814 on the reaction-chamber side from being exposed to the etching gas. In this state, the cleaning electrode 821 and the target substrate holder 803 form a parallel plate RF electrode structure. In a state wherein the etching gas 808 such as an $NF_3$ or $SF_6$ is fed into the reaction chamber 801, the inner wall of the reaction chamber 801 including the substrate holder 803 is grounded, and a high-frequency power is applied to the cleaning electrode 821. At this time, a plasma discharge occurs between the inner wall of the reaction chamber 801 and the cleaning electrode 821, and an unnecessary deposit adhered inside the reaction chamber 801 can be removed by plasma etching.

According to this embodiment, as in the previous embodiment, a deposit on the target substrate holder 803 can be almost uniformly etched, and an increase in time required for cleaning the inside of the target substrate holder 803 caused by variations in etching can be prevented.

In this embodiment, since the surface of the light-receiving window 814 on the reaction-chamber side is covered with the cleaning electrode 821, the etching gas is not supplied onto the surface of the light-receiving window 814. For this reason, the light-receiving window 814 is not fogged by the etching gas, and the transmittance of the light-receiving window 814 is not decreased. Therefore, a decrease in film forming rate can be prevented, and cumbersome replacement of the light-receiving window 814 is not required.

On the other hand, in a conventional photo-assisted CVD apparatus having an arrangement in which rod-like cleaning electrodes are respectively arranged on both the ends of a target substrate, when an F-based gas such as an $NF_3$ gas or an $SF_6$ gas is used as an etching gas, F radicals are produced by plasma decomposition, the F radicals react with hydrogen (H) contained in an amorphous Si film serving as an object to be etched or H contained in residual water to form HF radicals, and these radicals react with the material, e.g., synthetic quartz, of the light-receiving window to etch the light-receiving window, thereby decreasing the transmittance of the light-receiving window.

In this manner, according to this embodiment, the plate-like cleaning electrode 821 is arranged to cover the light-receiving window 814 during a cleaning operation. For this reason, the light-receiving window 814 is not fogged by etching, an etching time is considerably shortened, and a throughput can be considerably increased.

Figure 51:
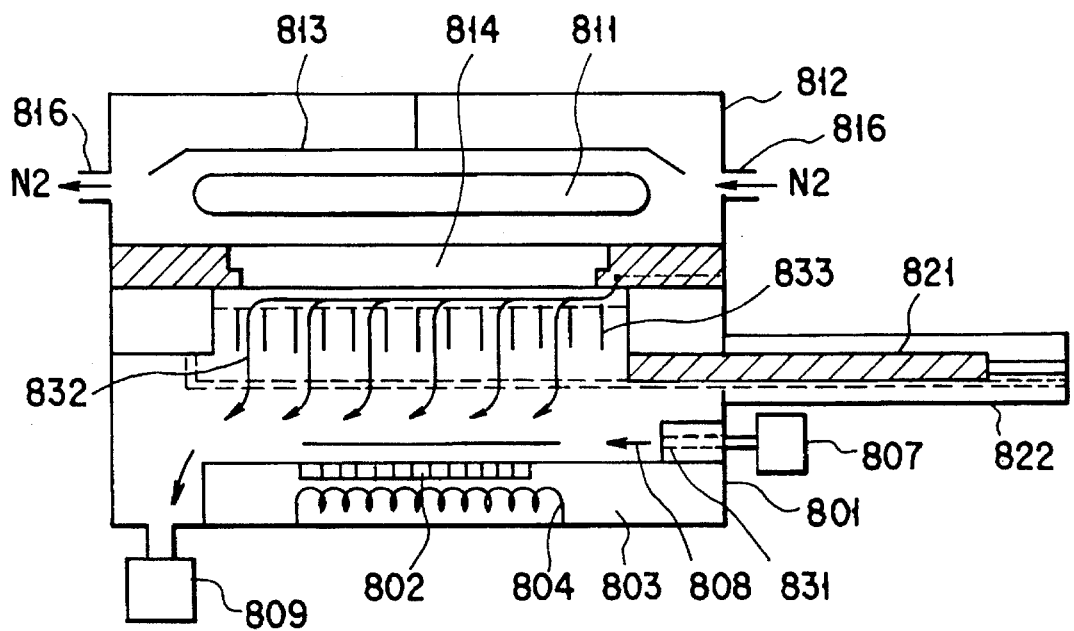
FIG. 51 is a schematic view showing the arrangement of a photo-assisted CVD apparatus according to the twenty-third embodiment of the present invention.

FIG. 51 is a schematic view showing the arrangement of a photo-assisted CVD apparatus according to the twenty-third embodiment of the present invention.

In the photo-assisted CVD apparatus of the embodiment shown in FIGS. 50A and 50B, a method of coating oil (e.g., Fonbrine oil) having a low vapor pressure on the surface of the light-receiving window 814 on the reaction-chamber side is applied to prevent film deposition which causes a decrease in transmittance of the light-receiving window 814. However, the oil must be periodically coated on the surface because the oil is gradually evaporated. The photo-assisted CVD apparatus of this embodiment solves this drawback.

That is, the photo-assisted CVD apparatus of this embodiment is different from each of the photo-assisted CVD apparatuses of the previous embodiments in that an inert gas is forcibly blown downward from the lower portion of a light-receiving window to prevent film deposition on the light-receiving window so as to protect the light-receiving window from film forming radicals.

In FIG. 51, reference numeral 831 denotes a slit-like gas nozzle. A gas 808 is fed like a sheet from the gas nozzle 831 into a reaction chamber 801. At the same time, an inert gas (purge gas) 832 for purging, e.g., an Ar gas, is blown downward through a flow guard plate 833 arranged at the lower portion of the light-receiving window 814. The purge gas 832 presses a source gas 808 fed from the slit nozzle 831 on the surface of the target substrate 802 to form the laminar flow of the source gas 808. In this state, light emitted from a light source 811 passes through the light-receiving window 814 and is radiated on the surface of the target substrate 802 to decompose the gas 808, thereby depositing a film on the target substrate 802. According to this method, the radicals which are produced by decomposing the source gas 808 and contribute to the film formation do not reach the light-receiving window 814 by the purge gas 832. For this reason, the transmittance of the light-receiving window 814 is not decreased by depositing a film on the light-receiving window 814.

When the inside of the reaction chamber 801 is to be cleaned, as in the previous embodiments, a cleaning electrode 821 is conveyed from an electrode storage portion 822 to a position immediately below the light-receiving window 814, and the cleaning electrode 821 is located to cover the light-receiving window 814 so as to prevent the surface of the light-receiving window 814 on the reaction-chamber side from being exposed to the etching gas. In a state wherein the etching gas 808 such as an $NF_3$ or $SF_6$ gas is fed into the reaction chamber 801, when a high-frequency power is applied to the cleaning electrode 821, an unnecessary deposit in the reaction chamber 801 can be removed by plasma etching. At this time, since the surface of the light-receiving window 814 on the reaction-chamber side is covered with the cleaning electrode 821, an etching species produced by decomposing the gas 808 is not supplied onto the surface of the light-receiving window 814. Therefore, as in the previous embodiments, a decrease in transmittance of the light-receiving window 814 caused by etching the light-receiving window 814 can be prevented.

According to this embodiment, a decrease in transmittance of the light-receiving window 814 in the film forming operation and the cleaning operation can be prevented, thereby increasing a throughput.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A photo-assisted CVD apparatus comprising:
   a reaction chamber for storing a substrate, said reaction chamber having a light-receiving window;
   means for feeding a source gas into said reaction chamber;
   means for radiating light through said light receiving window onto said source gas fed into said reaction chamber to decompose said source gas, thereby depositing a film on said substrate;
   means for supplying an etching gas into said reaction chamber;
   discharge electrode means, arranged between said light-receiving window and said substrate and having a single opening through which light is transmitted to said substrate, for exciting said etching gas; and
   means for feeding an inert gas into a space between said light receiving window and said discharge electrode means.

2. A photo-assisted CVD apparatus according to claim 1, wherein said discharge electrode means is comprised of a frame-like electrode.

3. A photo-assisted CVD apparatus according to claim 1, further comprising a shielding plate arranged between said light receiving window and said discharge electrode means.

4. A photo-assisted CVD apparatus according to claim 1, further comprising means for directing said inert gas to flow in a direction of said substrate to control a flow of said source gas.

5. A photo-assisted CVD apparatus comprising:
   a reaction chamber for storing a substrate;
   means for feeding a source gas into said reaction chamber;
   means for radiating light onto said source gas fed into said reaction chamber to decompose said source gas, thereby depositing a film on said substrate;
   means for supplying an etching gas into said reaction chamber;
   first discharge electrode means, arranged between said light receiving window and said substrate and having a single opening through which light is transmitted to said substrate, for exciting said etching gas; and
   second discharge electrode means, movable between a first position above said substrate and said reaction chamber and a second position outside said reaction chamber, for exciting said etching gas.

6. A photo-assisted CVD apparatus according to claim 5, wherein a surface of said second discharge electrode means is coated with an insulating material.

7. A photo-assisted CVD apparatus according to claim 5, wherein said first discharge electrode means is comprised of a frame-like electrode.

8. A photo-assisted CVD apparatus according to claim 5, wherein said reaction chamber comprises a light receiving window through which light is radiated, and a shielding plate arranged between said light-receiving window and said first discharge electrode means.

9. A photo-assisted CVD apparatus according to claim 5, wherein said reaction chamber further comprises inert gas feeding means for causing a gas inert to said source gas to flow in a direction of said substrate to control a flow of said source gas.

10. A photo-assisted CVD apparatus comprising:
    a reaction chamber for storing a substrate, said reaction chamber having a light receiving window;
    means for feeding a source gas into said reaction chamber;
    means for radiating light through said light receiving window onto said source gas fed into said reaction chamber to decompose said source gas, thereby depositing a film on said substrate;
    means for supplying an etching gas into said reaction chamber; and
    discharge electrode means, arranged between said light receiving window and said substrate and having a single opening through which light is transmitted to said substrate, for exciting said etching gas, said discharge electrode means covering said light receiving window while in said first position.

11. A photo-assisted CVD apparatus according to claim 10, wherein a surface of said discharge electrode means is coated with an insulating material.

12. A photo-assisted CVD method comprising the steps of:

feeding a source gas into a reaction chamber in which a substrate is stored;

radiating light into said reaction chamber through a light receiving window and a discharge electrode means having a single opening arranged above said substrate to decompose said source gas in said reaction chamber, thereby forming a thin film on said substrate by a chemical reaction;

feeding an etching gas into said reaction chamber and feeding a gas inert to said etching gas into said reaction chamber to cause the inert gas to flow in a direction from said light receiving window to said substrate; and producing an etching species in said reaction chamber by a plasma discharge to etch a deposit in said reaction chamber.

* * * * *